(12) United States Patent
Ohki et al.

(10) Patent No.: US 8,811,447 B2
(45) Date of Patent: Aug. 19, 2014

(54) SEMICONDUCTOR LASER WITH VARIED-WIDTH WAVEGUIDE AND SEMICONDUCTOR LASER MODULE INCLUDING THE SAME

(75) Inventors: Yutaka Ohki, Tokyo (JP); Satoshi Arakawa, Tokyo (JP); Shunsuke Okuyama, Tokyo (JP); Masaki Funabashi, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 204 days.

(21) Appl. No.: 13/030,536

(22) Filed: Feb. 18, 2011

(65) Prior Publication Data

US 2011/0206082 A1 Aug. 25, 2011

(30) Foreign Application Priority Data

Feb. 19, 2010 (JP) ................................. 2010-035333

(51) Int. Cl.
*H01S 3/063* (2006.01)
*H01S 3/13* (2006.01)

(52) U.S. Cl.
USPC ........................................ 372/66; 372/29.02

(58) Field of Classification Search
USPC ................................................ 372/66, 29.02
See application file for complete search history.

(56) References Cited

U.S. PATENT DOCUMENTS

| | | | | |
|---|---|---|---|---|
| 4,842,360 A | * | 6/1989 | Caro et al. ..................... 385/33 |
| 5,054,031 A | * | 10/1991 | Hosoba et al. ............ 372/46.012 |
| 5,574,741 A | * | 11/1996 | Arimoto .................. 372/45.012 |
| 5,974,068 A | * | 10/1999 | Adachi et al. .............. 372/46.01 |
| 6,310,995 B1 | * | 10/2001 | Saini et al. ...................... 385/28 |
| 6,414,976 B1 | * | 7/2002 | Hirata ..................... 372/45.013 |
| 6,807,213 B1 | | 10/2004 | Shimoyama et al. |
| 6,826,220 B2 | * | 11/2004 | Balsamo et al. ............. 372/50.1 |
| 2006/0274802 A1 | * | 12/2006 | Aoki et al. ................. 372/45.01 |
| 2007/0003183 A1 | * | 1/2007 | Shiba et al. ..................... 385/14 |

FOREIGN PATENT DOCUMENTS

| | | |
|---|---|---|
| JP | 63020888 | 1/1988 |
| JP | 10144991 A | 5/1998 |
| JP | 2000-312053 A | 11/2000 |
| JP | 2002280668 A | 9/2002 |
| JP | 2003158344 | 5/2003 |
| JP | 2005317954 | 11/2005 |

OTHER PUBLICATIONS

Japanese Decision of Patent dated Apr. 30, 2013, Japanese Application No. 2010-035333, 1 page.

* cited by examiner

*Primary Examiner* — Tod T Van Roy
*Assistant Examiner* — Marcia Golub-Miller
(74) *Attorney, Agent, or Firm* — Lowe Hauptman & Ham, LLP

(57) ABSTRACT

A semiconductor laser outputs a laser light from an output facet of a waveguide having an index waveguide structure, via a lens system. The waveguide includes, in order from a rear facet opposite to the output facet, a first narrow portion, a wide portion that is wider than the first narrow portion, a second narrow portion narrower than the wide portion, a first tapered portion formed between the first narrow portion and the wide portion, which expands toward the wide portion, and a second tapered portion formed between the wide portion and the second narrow portion, which narrows toward the second narrow portion. Each of the first narrow portion, the wide portion, and the second narrow potion has a uniform width.

8 Claims, 14 Drawing Sheets

FIG. 7A PRIOR ART
FIG. 7B PRIOR ART
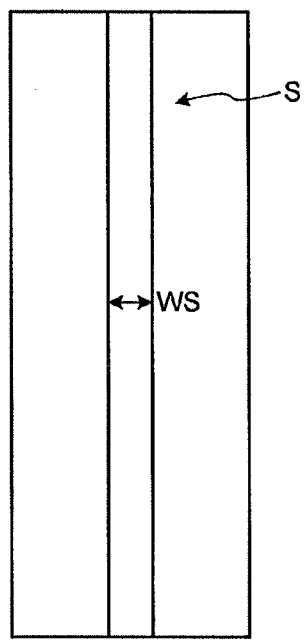
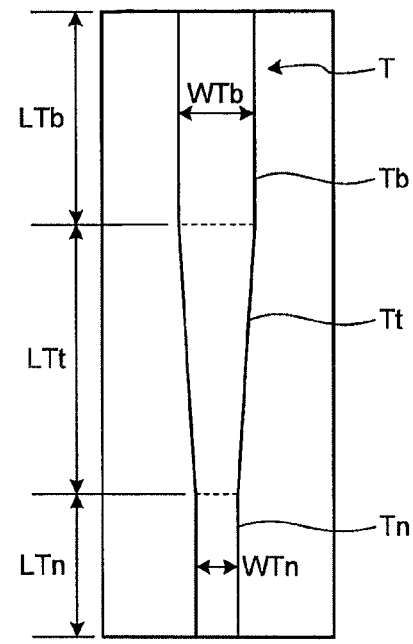
FIG. 8
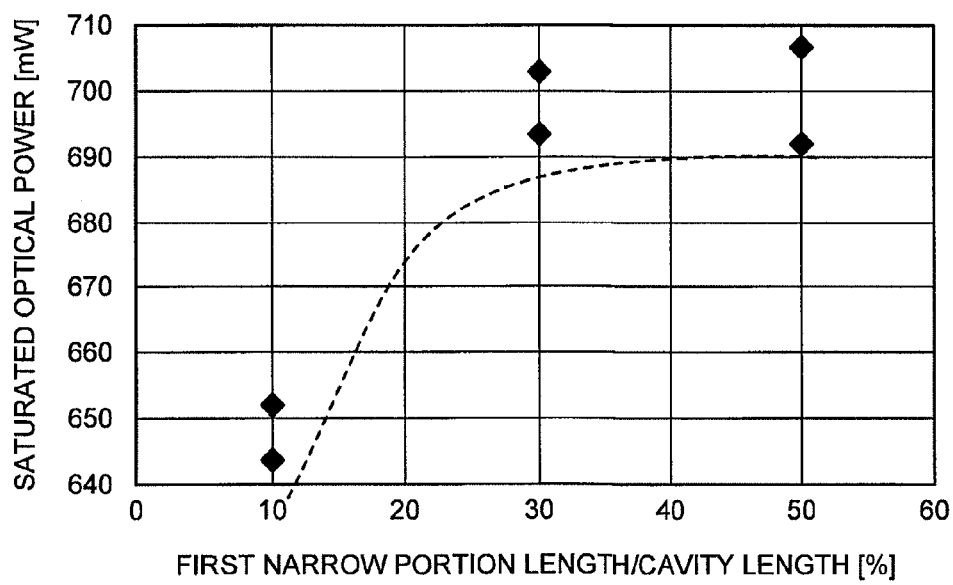

SEMICONDUCTOR LASER WITH VARIED-WIDTH WAVEGUIDE AND SEMICONDUCTOR LASER MODULE INCLUDING THE SAME

CROSS-REFERENCE TO RELATED APPLICATIONS

This application is based upon and claims the benefit of priority from the prior Japanese Patent Applications No. 2010-035333, filed on Feb. 19, 2010; the entire contents of which are incorporated herein by reference.

BACKGROUND OF THE INVENTION

1. Field of the Invention

The present invention relates to a semiconductor laser with an index waveguide structure and a semiconductor laser module including the semiconductor laser.

2. Description of the Related Art

A conventional semiconductor laser oscillates laser light by taking the light to make a roundtrip inside an optical resonator while amplifying the light by confining the light inside an active layer with an index waveguide structure. The laser light output from the semiconductor laser propagates through the space with a predetermined spread angle. Therefore, the output light usually is provided for use after being collimated and optically-coupled to a coupling target, such as an optical fiber and a recording surface of an optical disk, by a lens system.

In order to increase a saturated optical power of the semiconductor laser, it is effective to increase the width of a waveguide to reduce the electrical resistance. However, excessive expansion of the width of the waveguide is not preferable because a lateral mode of a waveguide mode turns into a multimode. For instance, in Japanese Patent Application Laid-Open No. 2002-280668, the width of the waveguide is increased only at an output facet side while the width of the waveguide at a rear facet side is kept to a width with which a single mode can be achieved, thereby providing a high-intensity laser light in a single mode.

In Japanese Patent Application Laid-Open No. 2002-280668, portions having different waveguide widths are connected by a tapered portion having a continuously changing width. In this description, a waveguide with a structure having such tapered portion being formed will be referred to as a tapered waveguide. On the other hand, a waveguide with a structure having its width being uniform along an optical waveguide direction will be referred to as a straight waveguide.

SUMMARY OF THE INVENTION

According to an aspect of the present invention, there is provided a semiconductor laser that outputs a laser light from an output facet of a waveguide having an index waveguide structure, via a lens system. The waveguide includes, in order from a rear facet opposite to the output facet, a first narrow portion, a wide portion that is wider than the first narrow portion, a second narrow portion narrower than the wide portion, a first tapered portion formed between the first narrow portion and the wide portion, which expands toward the wide portion, and a second tapered portion formed between the wide portion and the second narrow portion, which narrows toward the second narrow portion. Each of the first narrow portion, the wide portion, and the second narrow potion has a uniform width.

According to another aspect of the present invention, there is provided a semiconductor laser that outputs a laser light from an output facet of a waveguide having an index waveguide structure, via a lens system. The waveguide includes, in order from a rear facet opposite to the output facet, a first narrow portion, a wide portion wider than the first narrow portion, a first tapered portion formed between the first narrow portion and the wide portion, which expands toward the wide portion, and a second tapered portion narrowing from the side portion toward the output facet. Each of the first narrow portion and the wide portion has a uniform width. An inclination angle $\theta$ represented by $\theta = \arctan[(\Delta W/2)/Lt2]$ is 0.32 degrees or less, where $\Delta W$ is difference between a width of the wide portion and a width of the second tapered portion on the output facet side and $Lt2$ is length of the second tapered portion.

According to still another aspect of the present invention, there is provided a semiconductor laser module including a semiconductor laser that outputs a laser light from an output facet of a waveguide having an index waveguide structure, a coupling target to which the laser light is to be coupled, and a lens system that couples the laser light to the coupling target. The waveguide includes, in order from a rear facet opposite to the output facet, a first narrow portion, a wide portion that is wider than the first narrow portion, a second narrow portion narrower than the wide portion, a first tapered portion formed between the first narrow portion and the wide portion, which expands toward the wide portion, and a second tapered portion formed between the wide portion and the second narrow portion, which narrows toward the second narrow portion. Each of the first narrow portion, the wide portion, and the second narrow potion has a uniform width.

These and other objects, features, aspects, and advantages of the present disclosure will become apparent to those skilled in the art from the following detailed description, which, taken in conjunction with the annexed drawings, discloses preferred embodiments of the present disclosure.

BRIEF DESCRIPTION OF THE DRAWINGS

FIG. 7A is a diagram showing a straight waveguide structure of a waveguide in a semiconductor device according to a first comparative example;

FIG. 7B is a diagram showing a tapered waveguide structure of a waveguide in a semiconductor laser according to a second comparative example;

FIG. 8 is a graph showing a relationship between a ratio of a length of a first narrow portion to a cavity length and a saturated optical power;

DETAILED DESCRIPTION OF THE PREFERRED EMBODIMENTS

Figure 1:
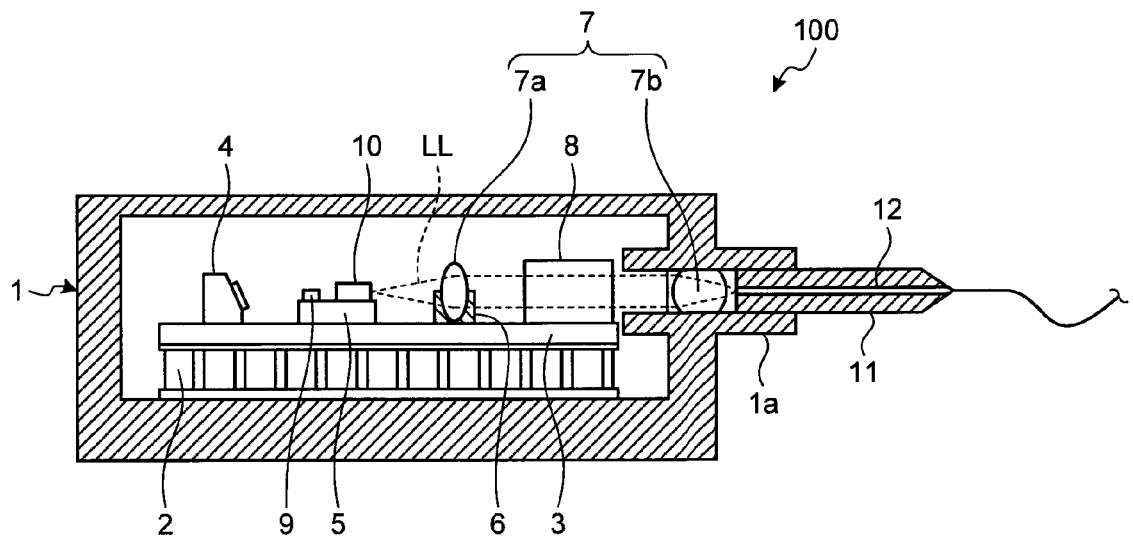
FIG. 1 is a schematic partial cross-sectional side view of a semiconductor module including a semiconductor laser according to a first embodiment of the present invention.

In a tapered waveguide, as a width of a waveguide on an output facet side is increased, a shape of a far field pattern (FFP) of an output laser light becomes more elliptical, which makes it difficult to couple the laser light to a coupling target using a lens system with high efficiency. Consequently, even if optical intensity (optical power) of laser light output from a semiconductor laser is increased, the usable optical power of laser light may not increase in a proportional manner.

In the following, semiconductor lasers and semiconductor laser modules according to embodiments of the present invention will be described in detail with reference to accompanying drawings. The present invention is not limited to the following embodiments. In the drawings, the same or corresponding structural elements are assigned with the same reference numerals. It should be noted that the drawings show schematic examples. Accordingly, a relationship between a thickness and a width of each layer, a ratio of the layers, and so on, may be different from real values. Among the drawings, there may be parts where the relationships and ratios of the shown sizes are different from one another.

FIG. 1 is a schematic partial cross-sectional side view of a semiconductor laser module including a semiconductor laser according to a first embodiment of the present invention.

As shown in FIG. 1, a semiconductor laser module 100 includes a housing 1, a Peltier module 2, a base plate 3, a monitoring photodiode 4, a heatsink 5, a first lens 7a, an isolator 8, a thermistor 9, a semiconductor laser 10, a second lens 7b, a ferrule 11, and an optical fiber 12. The housing 1 is a chassis made of, for example, Cu—W alloy. The Peltier module 2 is a temperature controller arranged on an inner bottom surface of the housing 1. The base plate 3 is arranged on the Peltier module 2. The monitoring photodiode 4, the heatsink 5, the first lens 7a, and the isolator 8 are arranged on the base plate 3 in this order. The first lens 7a is held by a lens holder 6 mounted on the base plate 3. The thermistor 9 and the semiconductor laser 10 are arranged on the heatsink 5. The second lens 7b and the ferrule 11 are held inside the projecting portion 1a of the housing 1. The optical fiber 12 is fixed to the ferrule 11 as being inserted in the ferrule 11.

The semiconductor laser 10 is driven by a driving current from a controller (not shown) and outputs a laser light LL from an output facet. The first lens 7a, the isolator 8, the second lens 7b, and the optical fiber 12 are located on an optical axis of the laser light LL. The first lens 7a is a spherical lens, for instance, and collimates the laser light LL. The isolator 8 prevents the laser light LL from returning to the semiconductor laser 10 due to reflection, or the like, while transmitting the laser light LL toward the second lens 7b. The second lens 7b is a spherical lens, for instance, and focuses the laser light LL to a facet of the optical fiber 12 to optically couple the laser light LL to the optical fiber 12. The focused laser light LL propagates through the optical fiber 12 and is used for a predetermined purpose. In the semiconductor laser module 100, the first lens 7a and the second lens 7b form a lens system 7.

The monitoring photodiode 4 is arranged at a back of a rear facet that is opposite to the output facet of the semiconductor laser 10. The monitoring photodiode 4 receives a laser light output from the rear faect. The controller detects optical intensity of the laser light LL based on an amount of light received by the monitoring photodiode 4, and controls the optical intensity of the laser light LL to a desired value by adjusting an amount of the driving current.

The thermistor 9 is located near the semiconductor laser 10. The controller detects a temperature of the semiconductor laser 10 based on a temperature detected by the thermistor 9, and controls the semiconductor laser 10 to a desired temperature by adjusting a current supply to the Peltier module 2. In order to improve cooling and heating efficiencies in the Peltier module 2, the base plate 3 and the heatsink 5 are preferably made of a material having high thermal conductivity, such as Cu—W alloy and diamond.

Figure 2:
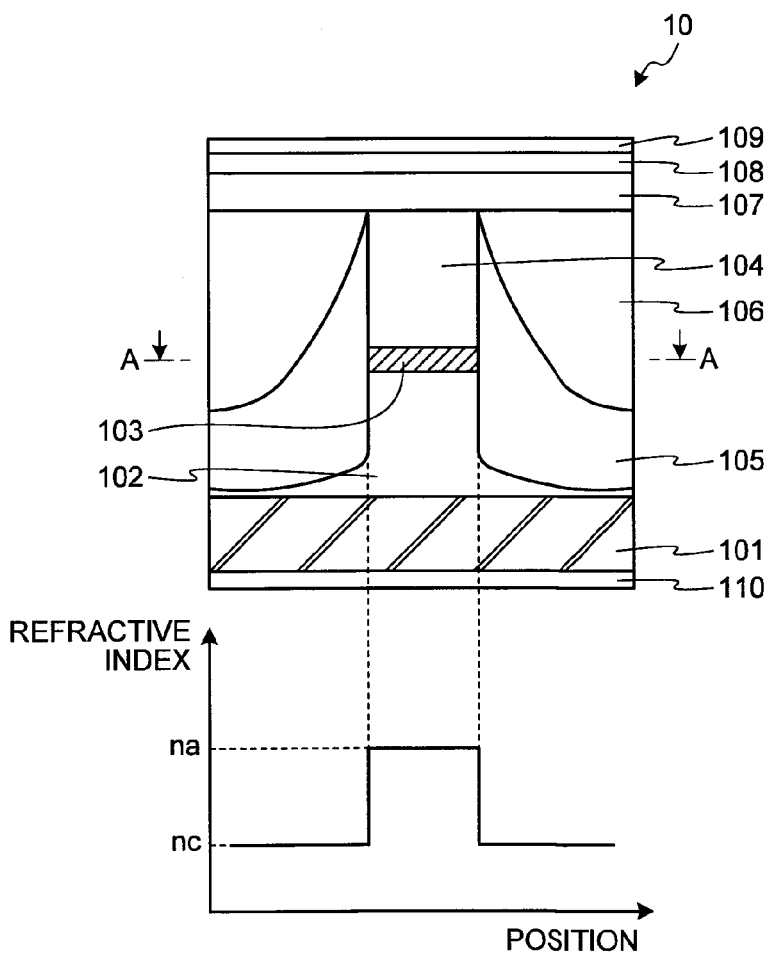
FIG. 2 is a diagram showing a schematic cross-section and a profile of equivalent refractive index in a plane perpendicular to an optical waveguide direction of the semiconductor laser shown in FIG. 1.

FIG. 2 is a diagram showing a schematic cross-section and a profile of equivalent refractive index in a plane perpendicular to an optical waveguide direction of the semiconductor laser 10. As shown in FIG. 2, the semiconductor laser 10 has a structure in which a lower cladding layer 102, an active layer 103, and an upper cladding layer 104 are epitaxially grown on a (100) plane of a substrate 101 in this order. The substrate 101 is made of n-InP. The lower cladding layer 102 is made of n-InP, and also serves as a buffer layer. The active layer 103 is made of an InGaAsP-based material, and has a separate confinement heterostructure multiple quantum well (SCH-MQW) structure. The upper cladding layer 104 is made of p-InP. The SCH-MQW structure has a structure in which quantum well layers and barrier layers are alternately layered with the top and bottom layers as the barrier layers, and the layered structure of the quantum well layers and the barrier layers is sandwiched between two separate confinement heterostructure (SCH) layers from up and down in the growth direction.

The lower cladding layer 102 in the upper part, the active layer 103, and the upper cladding layer 104 are processed into a mesa stripe shape. A lower blocking layer 105 and an upper blocking layer 106 are formed on both sides of the mesa stripe so that the mesa stripe is buried in the lower blocking layer 105 and the upper blocking layer 106. The lower blocking layer 105 and the upper blocking layer 106 are formed as current blocking layers. The lower blocking layer 105 is made of p-InP. The upper blocking layer 106 is made of n-InP. Accordingly, the semiconductor laser 10 has a buried heterostructure (BH). On the upper cladding layer 104 and the upper blocking layer 106, an upper cladding layer 107 made of p-InP and a contact layer 108 made of p-InGaAsP are laminated in this order. On the top surface of the contact layer 108, a p-side electrode 109 is formed, and on the back surface of the n-InP substrate 101, an n-side electrode 110 is formed.

The equivalent refractive index in FIG. 2 indicates an equivalent refractive index of the semiconductor layers at a position with respect to the growth direction (vertical direction). As shown in FIG. 2, in the semiconductor laser 10, an equivalent refractive index na of a region including the active layer 103 is higher than an equivalent refractive index nc at a side portion. With such arrangement, an index waveguide structure is formed in a width direction (horizontal direction) of the active layer 103.

Figure 3:
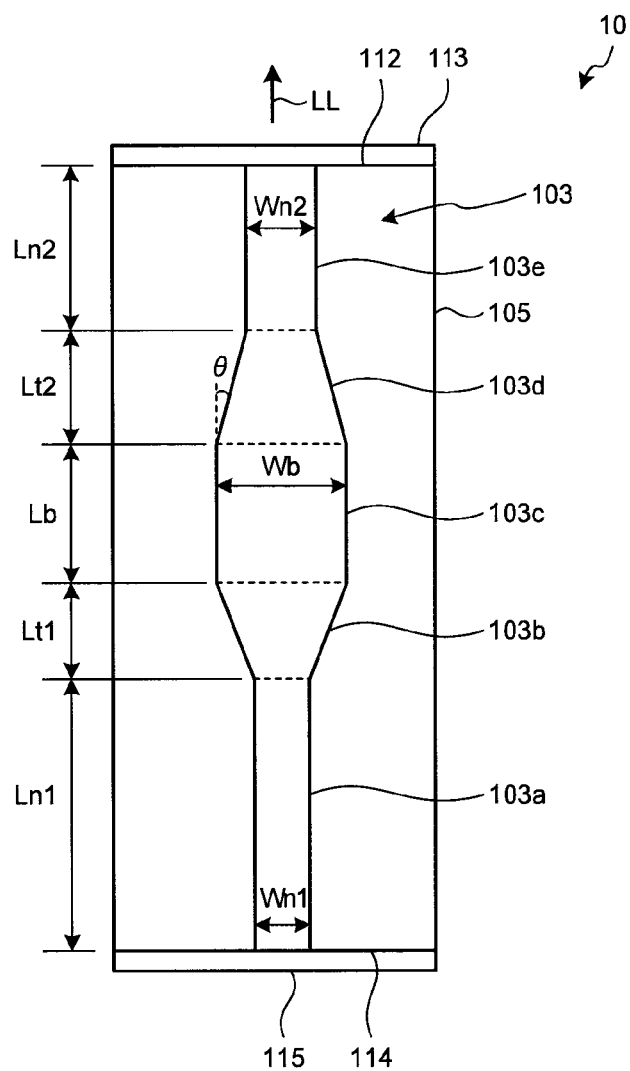
FIG. 3 is a cross-sectional view taken along line A-A, showing a waveguide structure of the semiconductor laser shown in FIG. 2.

FIG. 3 is a cross-sectional view taken along line A-A showing a waveguide structure of the semiconductor laser 10 shown in FIG. 2.

As shown in FIG. 3, on an output facet 112 in the optical waveguide direction of the semiconductor laser 10, a low reflection film 113 is formed. The low reflection film 113 has a reflectivity in a range of 0.01% to 5%, and preferably a low reflectivity in a range of 0.01% to 1% with respect to a wavelength of the laser light. On a rear facet 114 opposite to the output facet 112, a high reflection film 115 is formed. The high reflection film 115 has a reflectivity in a range of 80% to 100%, and preferably a high reflectivity in a range of 90% to 99%, with respect to the wavelength of the laser light. The output facet 112 on which the low reflection film 113 is formed and the rear facet 114 on which the high reflection film 115 is formed make up a Fabry-Perot resonator.

With such structure, light in the active layer 103 generated by the application of the driving current oscillates by the effect of optical amplification that the light receives while propagating through the active layer 103 and the effect by the optical resonator. The oscillated laser light is output as the laser light LL via the low reflection film 113.

Next, a structure of the waveguide formed by the active layer 103 will be specifically described. The waveguide formed by the active layer 103 includes a first narrow portion 103a, a wide portion 103c, a second narrow portion 103e, a first tapered portion 103b, and a second tapered portion 103d. The first narrow portion 103a, the wide portion 103c, and the second narrow portion 103e are formed in this order from the rear facet 114 side so that each of them has a uniform width.

The wide portion 103c has a width larger than the first narrow portion 103a. The second narrow portion 103e has a width smaller than the wide portion 103c. The first tapered portion 103b is formed between the first narrow portion 103a and the wide portion 103c, and expands toward the wide portion 103c. The second tapered portion 103d is formed between the wide portion 103c and the second narrow portion 103e, and narrows toward the second narrow portion 103e.

The first narrow portion 103a has a width Wn1 and a length Ln1. The wide portion 103c has a width Wb and a length Lb. The second narrow portion 103e has a width Wn2 and a length Ln2. The first tapered portion 103b has a length Lt1. The second tapered portion 103d has a length Lt2. Each of the first and second tapered portions 103b and 103d has a width same as each portion to be connected thereto at a connecting portion. For instance, the first tapered portion 103b has the same width as the first narrow portion 103a at the connecting portion with the first narrow portion 103a, and has the same width as the wide portion 103c at the connecting portion with the wide portion 103c.

The first narrow portion 103a has a function to ensure a single-mode property in the waveguide mode of the waveguide by filtering a higher-order waveguide mode that is now easy to occur in the waveguide due to the width of the wide portion 103c being large. In other words, even if the width of the wide portion 103c is large to allow the higher-order waveguide mode, the first narrow portion 103a does not allow the higher-order waveguide mode. Accordingly, because the waveguide mode allowed in the overall waveguide is only a fundamental mode, the waveguide has the single-mode property The first tapered portion 103b has a function to connect between the first narrow portion 103a and the wide portion 103c with low waveguide loss. The second tapered portion 103d has a function to connect between the wide portion 103c and the second narrow portion 103e with low waveguide loss.

An electric resistance of the wide portion 103c is reduced due to the width of the waveguide being large, so that the wide portion 103c has a function to increase the intensity of a saturated optical power.

The second narrow portion 103e makes a far field pattern of the output laser light LL approach an isotropic shape, so that the second narrow portion 103e has a function of enabling the laser light LL to couple to the optical fiber 12 with high efficiency by the lens system 7.

Figure 4:
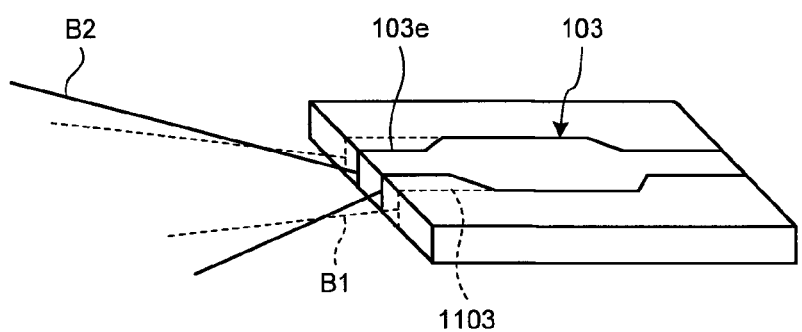
FIG. 4 is a schematic view showing expansion and far field patterns of laser lights output from a waveguide in the semiconductor laser according to the first embodiment and from a waveguide being a conventional tapered waveguide.

FIG. 4 is a schematic view showing expansion and far field patterns of laser lights output from the waveguides formed by the active layer 103 in the semiconductor laser 10 according to the first embodiment and by an active layer 1103 being a conventional tapered waveguide structure. The active layer 1103 has the same shape as the active layer 103 except for the portions shown in broken lines. In addition, the laser lights output from the active layers 1103 and 103 have beam sizes B1 and B2 in the width direction (horizontal direction), respectively.

As shown in FIG. 4, in the case of the active layer 1103, the width of the waveguide is large at an output edge of the laser light, whereby expansion of the beam size B1 becomes small. On the other hand, because the thickness of the active layer 1103 is smaller than the width thereof, expansion of the beam size B2 becomes large in the vertical direction. Consequently, the beam shape of the far field pattern of the laser light output from the active layer 1103 becomes an ellipse.

Such situation in which the beam shape of the far field pattern is an ellipse is a situation in which beam expansion in the horizontal direction is different from beam expansion in the vertical direction. Therefore, if the laser light is coupled to a coupling target such as an optical fiber using a lens system including a spherical lens, the coupling efficiency decreases. The decrease of the coupling efficiency is reduced by using an asymmetric lens. However, for instance, because tolerance of the coupling efficiency of the asymmetric lens with respect to a value of the FFP of the semiconductor laser is small, there are few merits in using such asymmetric lens for fabricating a semiconductor laser as an industrial product.

On the other hand, in the case of the active layer 103, the beam expansion of the beam size B2 in the horizontal direction becomes large due to the effect of the second narrow portion 103e. Consequently, the beam shape of the far field pattern of the laser light output from the active layer 103 approaches a circle. Therefore, even when a lens system including the spherical lens is used, the laser light can be coupled to the coupling target with high efficiency.

Moreover, as described above, because the intensity of the saturated optical power of the active layer 103 is increased by the arrangement of the wide portion 103c, it is possible to couple the high-intensity laser light LL to the optical fiber 12 with even higher efficiency using the lens system 7. Consequently, it is possible to output a higher-intensity laser light from the semiconductor laser 10.

As described above, the semiconductor laser 10 according to the first embodiment can output a high-intensity laser light via the lens system 7, and the semiconductor laser module 100 including the semiconductor laser 10 can also output a high-intensity laser light from the optical fiber 12.

Figure 5:
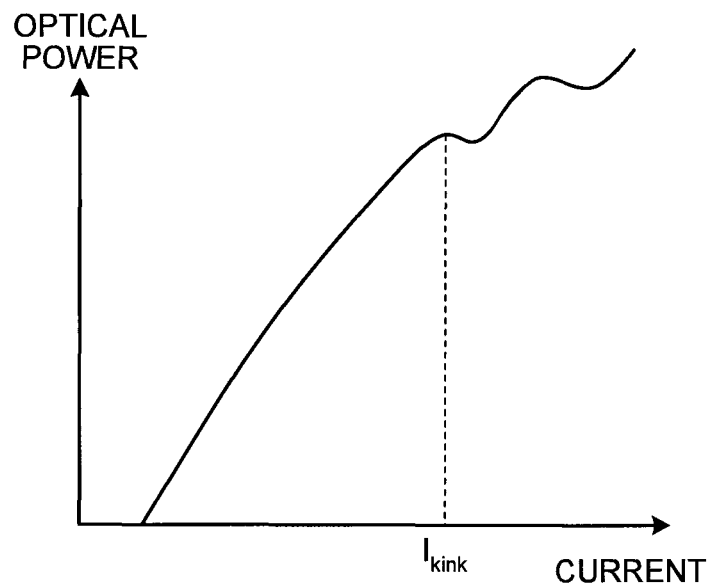
FIG. 5 is a diagram explaining a kink current.

In the following, preferred structural parameters of the waveguide (length, width, and so forth, of each portion) formed by the active layer 103 in the semiconductor laser 10 according to the first embodiment will be specifically described mainly based on experimental data. In the following explanation, as shown in FIG. 5, a kink current ($I_{kink}$) has a current value at which a kink (inflection) is generated in a curve showing a current-optical power characteristic of the semiconductor laser. The kink is one factor that limits the maximum optical power. Therefore, the kinks should be properly controlled in such high-power semiconductor laser as in the present embodiment.

Figure 6:
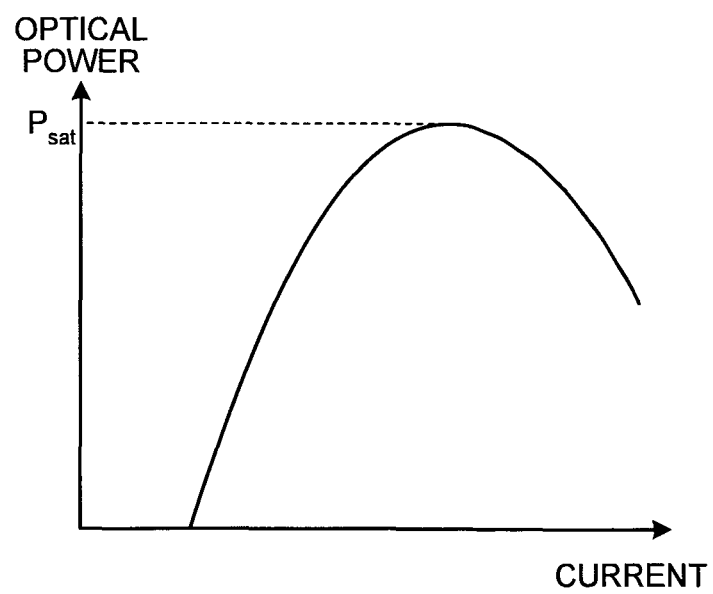
FIG. 6 is a diagram explaining a saturated optical power.

As shown in FIG. 6, the saturated optical power ($P_{sat}$) is a maximum value of an optical power of a semiconductor laser.

In the following, explanation will be made while referring to semiconductor lasers according to first and second comparative examples as appropriate. FIG. 7A is a diagram showing a straight waveguide structure of a waveguide S in a semiconductor device according to the first comparative example. FIG. 7B is a diagram showing a tapered waveguide structure of a waveguide T in a semiconductor laser according to the second comparative example. In both the first and second comparative examples, the semiconductor lasers are made of the same material and have the same cross-sectional structure as the semiconductor laser 10 according to the first embodiment, and the central wavelength of laser lights output from the semiconductor lasers is 1.48 µm. As shown in FIG. 7A, the width of the uniform-width waveguide S in the first comparative example is referred to as a width WS. As shown in FIG. 7B, in the second comparative example, the waveguide T includes a narrow portion Tn, a wide portion Tb, and a tapered portion Tt. The narrow portion Tn and the wide portion Tb are formed in this order so that each of them has a uniform width. The tapered portion Tt is formed between the narrow portion Tn and the wide portion Tb, and expands toward the wide portion Tb. The narrow portion Tn has a width WTn and a length LTn. The wide portion Tb has a width WTb and a length LTb. The tapered portion Tt has a length LTt. The waveguide structure of the semiconductor laser according to the first embodiment will be referred to as a barrel waveguide as appropriate.

First, a preferred range of the entire length of the waveguide formed by the active layer 103 will be described. As shown in FIG. 3, in the first embodiment, the entire length of the waveguide is equal to a cavity length of an optical resonator that includes the output facet 112 and the rear facet 114. The entire length of the waveguide is preferably equal to or longer than 1000 µm to obtain a high saturated optical power and equal to or shorter than 4000 µm to obtain sufficient slope efficiency. Especially, for instance, in a case of the high-power semiconductor laser of which optical power from the optical fiber is equal to or greater than 300 mW as in the first embodiment, the cavity length is preferably equal to or longer than 1000 µm.

Next, a preferred range of the length Ln1 of the first narrow portion 103a will be described. FIG. 8 is a graph showing a relationship between a ratio of the length Ln1 of the first narrow portion 103a to the cavity length and the saturated optical power. In FIG. 8, the cavity length is 2500 µm. As for other structural parameters, the length Lt1 is 300 µm, the length Lt2 is 300 µm, the length Ln2 is 30 µm, the widths Wn1 and Wn2 are 3.0 µm, and the width Wb is 5.0 µm. A performance characteristic is detected while changing the length Lb for each value of the length Ln. In FIG. 8, a broken line is a guiding line.

As shown in FIG. 8, when the ratio of the length Ln1 to the cavity length is increased from 10%, a filtering effect with respect to a higher-order mode increases, whereby the saturated optical power becomes larger. When the ratio becomes equal to or greater than 30%, almost all the higher-order modes are removed. Therefore, it is preferable that the ratio of the length Ln1 of the first narrow portion 103a to the cavity length be equal to or greater than 30%. Moreover, the ratio is preferably equal to or less than 65%, for instance, to achieve sufficient effects of reduction of electrical resistance and improvement of the saturated optical power by the arrangement of the wide portion 103c. The ratio of the wide portion 103c to the first narrow portion 103a in the cavity length of the resonator significantly contributes to the characteristics. Accordingly, the horizontal axis in FIG. 8 indicates the ratio instead of the value of the length Ln1.

A preferred range with respect to the length Ln2 of the second narrow portion 103e and the length Lt2 of the second tapered portion 103d will be described in detail later. Here, the reason why the lengths Ln2 and Lt2 preferably smaller will be described.

The lengths Ln2 and Lt2 are preferably smaller to achieve sufficient effects of reduction of electrical resistance and improvement of the saturated optical power by the arrangement of the wide portion 103c. The length Ln2 is preferably equal to or shorter than 200 µm, and more preferably equal to or shorter than 50 µm, for example, equal to or shorter than 30 µm.

Figure 9:
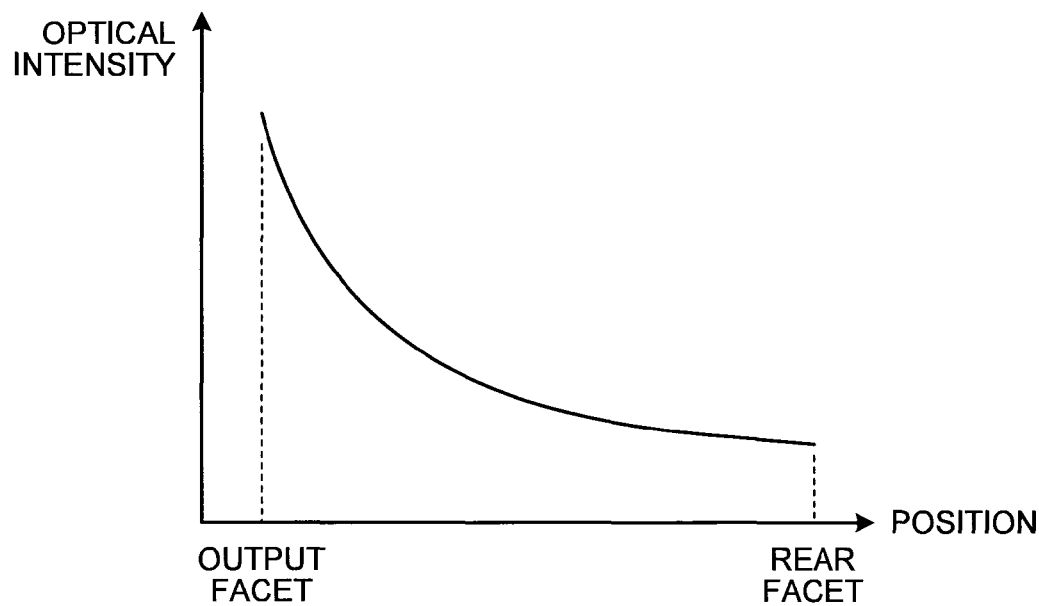
FIG. 9 is a graph showing a distribution of optical intensity in an optical waveguide direction of a waveguide of a Fabry-Perot resonator.

It is preferable to further make the lengths Ln2 and Lt2 small because the distribution of the optical intensity in the optical waveguide direction of the waveguide and the distribution of carriers match more closely. More specifically, when a Fabry-Perot resonator such as the semiconductor laser 10 is used, the optical intensity of the waveguide in the optical waveguide direction is distributed in such a way as to increase toward the output facet from the rear facet as shown in FIG. 9. Therefore, as the optical intensity increases, the number of necessary carriers increases toward the output facet. In the case of the tapered waveguide, especially near the output facet, the number of carriers required based on an intrinsic optical intensity distribution of the Fabry-Perot resonator can be supplied easier than in the case of the straight waveguide, so that high power can be realized. The reduction of electrical resistance caused by the wide portion 103c also contributes to the achievement of high power. Due to the arrangement of the second narrow portion 103e and the second tapered portion 103d in front of the wide portion 103c, the light having been amplified while propagating from the rear facet to the output facet is confined to a narrow region, whereby supply of the number of carriers required based on the optical intensity becomes insufficient. Therefore, a phenomena leading to a kink such as a hole-burning may easily occur. Accordingly, it is preferable that the length Ln2 of the second narrow portion 103e, which is narrower than the wide portion 103c and has a small number of carriers, and the length Lt2 of the second tapered portion 103d be small because unconformity between the distribution of the optical intensity and the distribution of the carriers becomes smaller and thus occurrence of the kink is suppressed.

The output facet 112 of the semiconductor laser 10 is generally formed by cleaving the substrate after a laminated structure of semiconductors and electrodes as shown in FIG. 2 are formed on the substrate. Therefore, the length Ln2 is preferably greater than the variations in positional accuracy of the cleavage and equal to or greater than 10 μm, for example.

Next, a preferred range of the length Lt1 of the first tapered portion 103b will be described. For preventing a waveguide loss caused by drastic expansion in the width of the waveguide, the length Lt1 of the first tapered portion 103b is preferably equal to or greater than 100 μm, and for instance, 300 μm. Moreover, the length Lt1 is preferably equal to or shorter than 1000 μm, for instance, to achieve sufficient effects of reduction of electrical resistance and improvement of the saturated optical power by the arrangement of the wide portion 103c.

Next, preferred ranges of the width Wn1 of the first narrow portion 103a, the width Wb of the wide portion 103c, and the width Wn2 of the second narrow portion 103e will be described. For reducing the electrical resistance of the first narrow portion 103a, the width Wn1 is preferably equal to or wider than 2.0 μm. and for instance 2.7 μm. Moreover, the width Wn1 is preferably equal to or narrower than 4.0 μm to suppress the kink caused by a higher-order waveguide mode. The width Wb is preferably equal to or wider than 4.0 μm, and particularly equal to or wider than 5.0 μm, for achieving a sufficient effect of reduction of electrical resistance by the arrangement of the wide portion 103c. Furthermore, the width Wb is preferably equal to or narrower than 8.0 μm, and particularly equal to or narrower than 6.0 μm, for suppressing occurrence of the kink. The width Wn2 is preferably equal to or wider than 2.0 μm, and particularly equal to or wider than 2.5 μm, for preventing reduction in the optical power and the coupling efficiency. The width Wn2 can be 2.7 μm, for instance. Moreover, the width Wn2 is preferably equal to or narrower than 5.0 μm, and particularly equal to or narrower than 4.0 μm, for preventing reduction in the coupling efficiency. A preferred range of the width Wn2 of the second narrow portion 103e will be described in further detail later.

Figure 10:
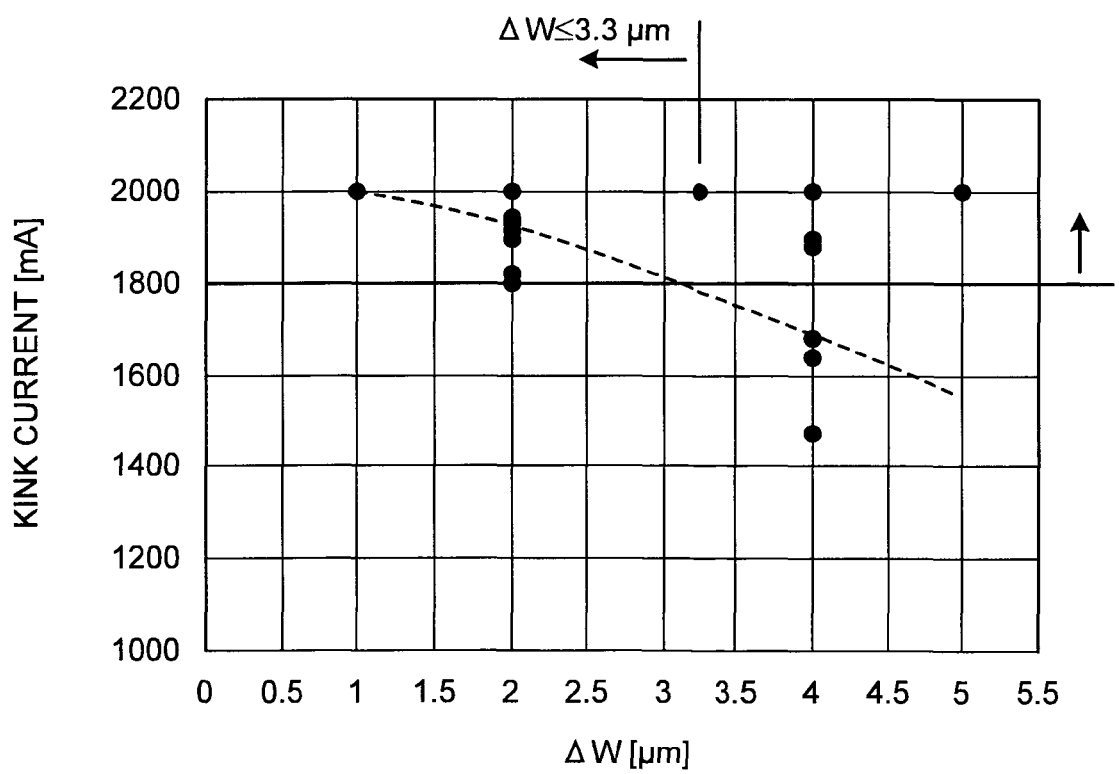
FIG. 10 is a graph showing a relationship between a difference ΔW between a width of a wide portion and a width of a second narrow portion and a kink current.

Next, a preferred range of a difference ΔW between the width Wb of the wide portion 103c and the width Wn2 of the second narrow portion 103e will be described. FIG. 10 is a graph showing a relationship between the difference ΔW between the widths and a kink current. In FIG. 10, the cavity length is 2000 μm. As for other structural parameters, the length Ln1 is set to 750 μm that is 38% of the cavity length, the lengths Lt1 and Lt2 are set to 300 μm, the length Ln2 is set to 30 μm, the length Lb is set to 620 μm, the width Wn1 is set to 2.7 μm, the width Wn2 is changed in a range of 1.0 μm to 5.0 μm on a sample basis, and the width Wb is set to 5.0 μm or 6.0 μm. Because the maximum current value in the measurement is 2000 mA, if the kink does not occur a data point of the kink current is plotted as 2000 mA. Therefore, when the kink current is 2000 mA, data points overlap with one another in some cases, however, the number of sampling for each difference ΔW is set to be at least three. In FIG. 10, the broken line is a guiding line.

When the difference ΔW becomes greater, mismatch of the waveguide mode between the wide portion 103c and the second narrow portion 103e becomes greater. This may produce a kink. As shown in FIG. 10, when the difference ΔW is 4 μm, the kink current becomes less than 1800 mA in some cases, which is a level causing no practical problem. On the other hand, when the difference ΔW is equal to or less than 3.3 μm, especially equal to or less than 2.5 μm, the kink current becomes equal to or greater than 1800 mA more reliably, which is preferable. Moreover, the difference ΔW is preferably equal to or greater than 1.0 μm for achieving a sufficient effect of the formation of the second narrow portion 103e.

Next, a preferred range of an inclination angle θ in a case where a degree of narrowing of the second tapered portion 103d toward the second narrow portion 103e is shown by the inclination angle θ shown in FIG. 3 will be described. The inclination angle θ is expressed as arctan[(ΔW/2 )/Lt2 ]. When the inclination angle θ is larger, the state of the waveguide becomes abnormal due to drastic reduction in the width of the waveguide, which results in causing deformation in the far field pattern of the output laser light and a kink.

Figure 11:
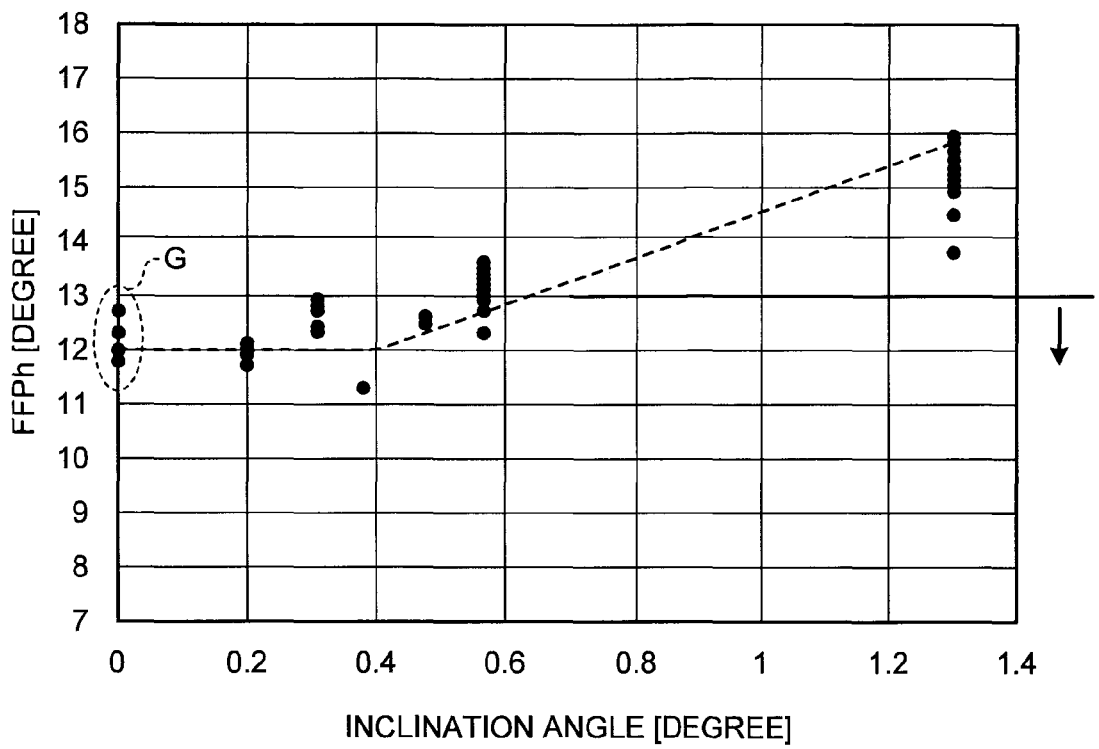
FIG. 11 is a graph showing a relationship between an inclination angle and an FFPh.

FIG. 11 is a graph showing a relationship between the inclination angle θ and an angle of the far field pattern (FFPh) in the horizontal direction. In FIG. 11, the cavity length is 2000 μm. As for other structural parameters, the length Ln1 is set to 750 μm that is 38% of the cavity length, the length Lt1 is set to 300 μm, the length Ln2 is set to 30 μm, the length Lt2 is set to 50 μm, 100 μm or 300 μm, the width Wn1 is set to 2.7 μm, the width Wn2 is changed in a range of 1.0 μm to 4.0 μm on a sample basis, the width Wb is set to 5.0 μm or 6.0 μm, and the difference ΔW is changed in a range of 1.0 μm to 5.0 μm on a sample basis.

In FIG. 11, the data point group G shows the FFPh in the first comparative example being the straight waveguide assuming that a value of the inclination angle θ is zero. The cavity length of the waveguide S (see FIG. 7A) of the first comparative example is set to 2000 μm, and the width WS of the waveguide is changed in a range of 2.0 μm to 4.0 μm on a sample basis. This is within the range of the width Wn2 of the barrel waveguide shown in FIG. 11. In FIG. 11, a broken line is a guiding line.

As shown in FIG. 11, the average value of the FFPh of the data point group G that is data of the first comparative example is approximately 12 degrees. Because there is no drastic change in the width of the waveguide in the case of the first comparative example, when the FFPh is 12 degrees, it is possible to assume that no deformation has occurred in the FFPh.

On the other hand, in the case of the first embodiment, when the inclination angle θ becomes greater, the average value becomes greater due to the deformation of the FFPh. When the inclination angle θ is in a range of 0 degree to 0.48 degrees, a center value of the FFPh is 12 degrees, and values of all points of the FFPh are equal to or less than 13 degrees. Accordingly, when the FFPh becomes greater than 12 degrees by 1 degree or more, the state of the waveguide is considered abnormal. When the inclination angle θ is 0.57 degrees, it is found that some FFPhs are equal to or less than 13 degrees.

Furthermore, it is found from the guiding line that when the inclination angle θ is equal to or less than 0.6 degrees, the FFPh can become equal to or less than 13 degrees. Based on the above description, it is preferable that the inclination angle θ be equal to or less than 0.6 degrees, more preferably equal to or less than 0.57 degrees, and even more preferably equal to or less than 0.48 degrees because occurrence of deformation in the FFPh can be suppressed and thus the coupling efficiency of the laser light with the coupling target is be reduced.

Figure 12:
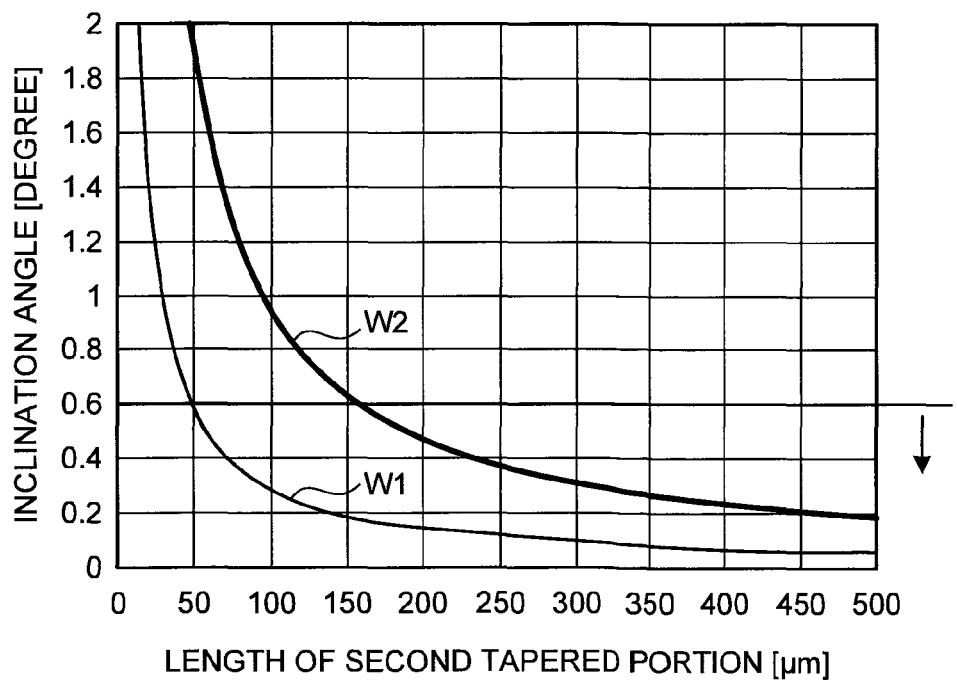
FIG. 12 is a graph showing a calculation value in a relationship between a length of a second tapered portion and an inclination angle in upper and lower limits of a preferred difference ΔW.

Next, a preferred range of the length Lt2 of the second tapered portion 103d will be described. FIG. 12 is a graph showing a calculation value of a relationship between the length Lt2 of the second tapered portion 103d and the inclination angle θ in upper and lower limits (1.0 μm and 3.3 μm) of a preferred difference ΔW. If a condition in which the difference ΔW is within the range of 1.0 μm to 3.3 μm and a condition in which the inclination angle θ is equal to or less than 0.6 degrees are both satisfied, occurrence of the kink can be further suppressed based on the reasons described above, which is particularly a preferable status. As shown in FIG. 12, when the length Lt2 is shorter than 50 μm, it is not possible to satisfy both of the two conditions at the same time. Therefore, it is particularly preferable that the length Lt2 be equal to or longer than 50 μm. The length Lt2 equal to or longer than 150 μm is further preferable because it can reliably satisfy the two conditions. For instance, the length Lt2 is 300 μm, which is preferably equal to or shorter than 400 μm. The length Lt2 is preferably as small as possible, for instance, about 100 μm, to achieve sufficient effects of reduction of electrical resistance and improvement of the saturated optical power by the arrangement of the wide portion 103c and to reduce the above-described unconformity between the distribution of the optical intensity and the distribution of the carriers. In the case where the length Lt2 is set within the range of 50 μm to 150 μm as described above, if attention is only focused on the condition in which the difference ΔW is within the range of 1.0 μm to 3.3 μm, the inclination angle δ largely deviates from 0.6 degrees, so that the length Lt2 is more preferably set to satisfy both conditions of the difference ΔW and the inclination angle θ.

As described above, the length Lt2 is preferably within the range of about 50 μm to 400 μm. If the length Lt2 is large within the preferable range, instability of the waveguide mode caused by the drastic change of the width of the waveguide can be further suppressed. If the length Lt2 is small within the preferable range, the electrical resistance can be further reduced and the unconformity between the distribution of the optical intensity and the distribution of the carriers can be further suppressed.

In the first embodiment, the width of the waveguide changes linearly in both the first tapered portion 103b and the second tapered portion 103d along the optical waveguide direction. However, the first tapered portion 103b and the second tapered portion 103d are not limited to such shapes. As long as they are capable of connecting the first narrow portion 103a, the wide portion 103c, and the second narrow portion 103e smoothly, the width of the waveguide can change, for instance, exponentially or in any other changing manners. However, the width of the waveguide preferably changes in a monotonically increasing or decreasing manner. Here, even if the changing manner of the width of the waveguide of the second tapered portion 103d is not linear, the value of the inclination angle θ is defined in the same way as in the case of the above-described linear changing manner. In other words, an angle formed by connecting the edges of the wide portion 103c and the second narrow portion 103e with straight lines is defined as the inclination angle θ.

Figure 13:
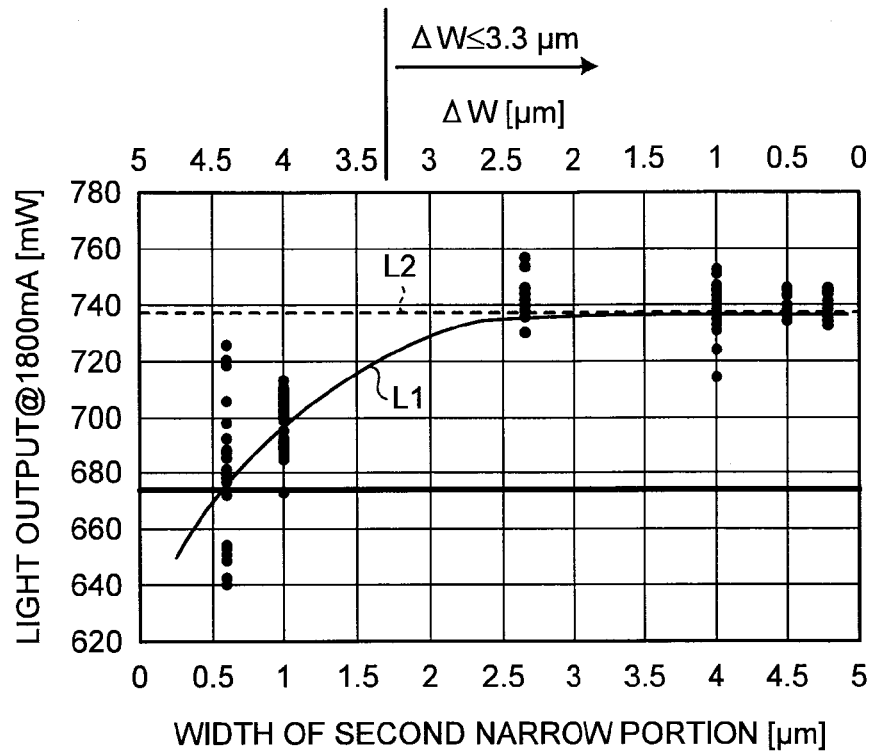
FIG. 13 is a graph showing a relationship between the width of the second narrow portion and an optical power in a case where a driving current is 1800 mA in the first embodiment and the first and second comparative examples.

Next, the preferred range of the width Wn2 of the second narrow portion 103e will be described in more detail. FIG. 13 is a graph showing a relationship between the width of the second narrow portion and an optical power in a case where a driving current is 1800 mA in the first embodiment and the first and second comparative examples. FIG. 13 also shows values of the difference ΔW in the first embodiment. A thin solid line in FIG. 13 is a guiding line of data points in the first embodiment.

In FIG. 13, the cavity length is 2000 μm. As for other structural parameters, the length Ln1 is set to 750 μm that is 38% of the cavity length, the length Lt1 is set to 300 μm, the length Ln2 is set to 30 μm, the length Lt2 is set to 50 μm, 100 μm or 300 μm, the width Wn1 is set to 2.7 μm, the width Wn2 is changed in a range of 0.6 μm to 4.8 μm on a sample basis, and the width Wb is set to 5.0 μm.

The cavity length of the waveguide S (see FIG. 7A) of the first comparative example is set to 2000 μm, and the width WS of the waveguide is set to 2.7 μm. The cavity length of the waveguide T (see FIG. 7B) of the second comparative example is set to 2000 μm, the length LTn of the narrow portion Tn is set to 750 μm that is 38% of the cavity length, the length LTt of the tapered portion Tt is set to 300 μm, the length LTb of the wide portion Tb is set to 950 μm, the width WTn1 of the narrow portion Tn is set to 2.7 μm, and the width Wtb of the wide portion Tb is set to 5.0 μm.

As shown in FIG. 13, an optical power in the second comparative example being the tapered waveguide is higher than an optical power in the first comparative example being the straight waveguide. On the other hand, as for the first embodiment, when the width Wn2 is equal to or wider than 2.7 μm, it is possible to obtain an optical power similar to that in the second comparative example. Therefore, the width Wn2 of equal to or wider than 2.7 μm is preferable. The optical power decreases as the width Wn2 becomes narrower. When the width Wn2 is equal to or narrower than 1 μm, there are cases in that the optical power becomes less than that in the first comparative example. When the width Wn2 is 0.6 μm, the optical power is averagely similar to that in the first comparative example. It is considered that decrease of the optical power is due to the occurrence of the kink. As is obvious from FIG. 13, the difference ΔW of equal to or less than 3.3 μm is preferable because occurrence of the kink can be suppressed as described above and thus it is possible to obtain a high optical power similar to that in the second comparative example.

Next, referring to FIGS. 14 to 19, a preferred range of the width Wn2 of the second narrow portion 103e in terms of a point of the coupling efficiency between the laser light and the optical fiber 12 will be described using calculation results and experimental data. The coupling efficiency shown below is for a case where both the first lens 7a and the second lens 7b in the lens system 7 as a double-lens system are spherical lenses.

In the following, description will be given on two cases in which structures of the active layers 103 (a laser structure X and a laser structure Y) are different. In the laser structure X, a quantum well layer has a three-layer structure, the thickness of the active layer 103 is 0.129 μm, and an equivalent refractive-index difference Δn (=na−nc) is 0.004. In the laser structure Y, a quantum well layer has a five-layer structure, the thickness of the active layer 103 is 0.141 μm, and the equivalent refractive-index difference Δn is 0.01.

Figure 14:
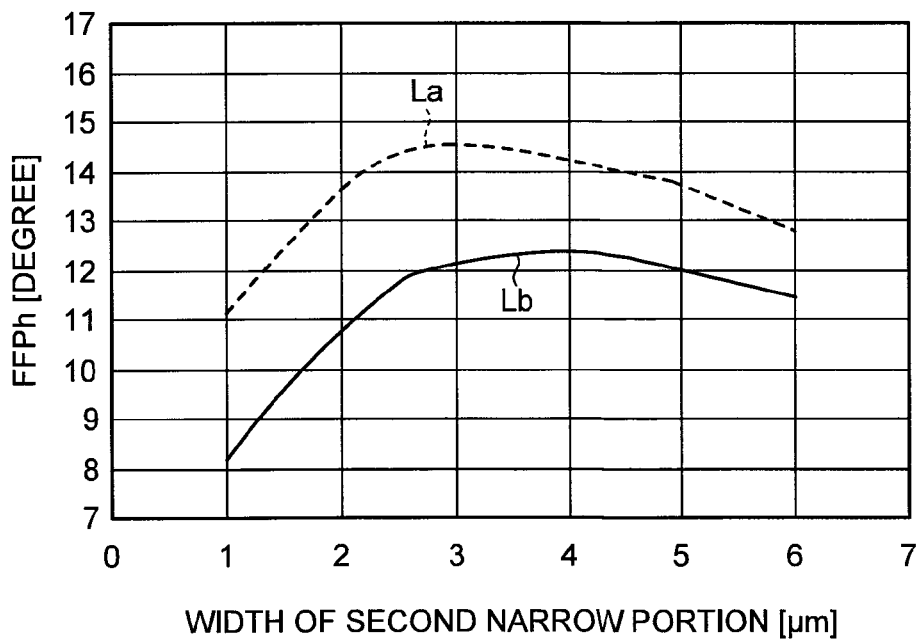
FIG. 14 is a graph showing a relationship between the width of the second narrow portion and an FFPh.
Figure 15:
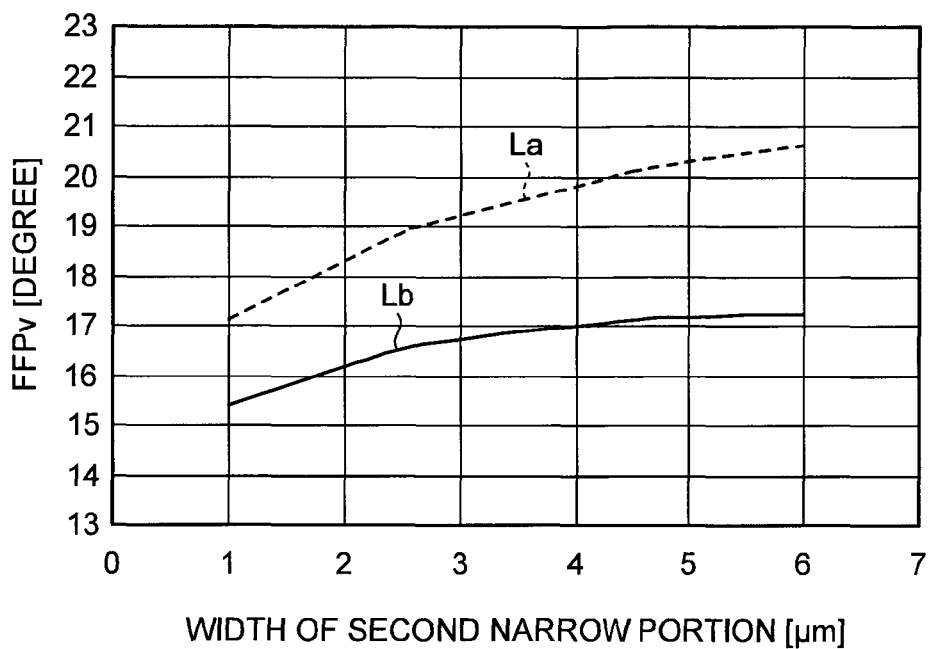
FIG. 15 is a graph showing a relationship between the width of the second narrow portion and an FFPv.
Figure 16:
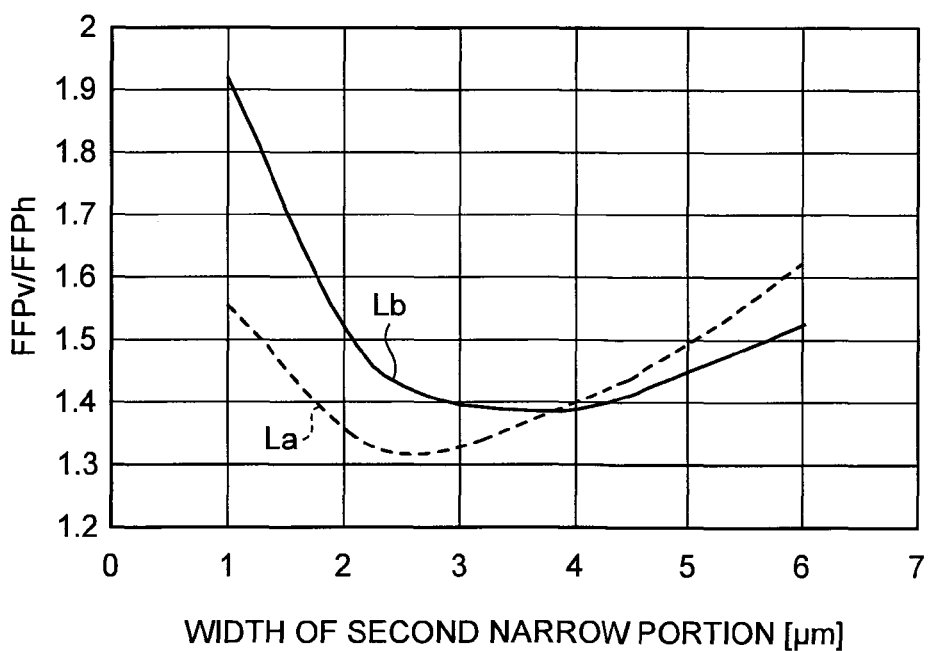
FIG. 16 is a graph showing a relationship between the width of the second narrow portion and an FFPv/FFPh.

FIGS. 14 to 16 show calculation results. In the calculation, the structure of the active layer 103 and a width of an output facet are considered. FIGS. 14 to 16 show calculation values of relationships between the width Wn2 of the second narrow portion 103e and the FFP. When the semiconductor laser operates normally, the FFP depends on the width of the waveguide of the output facet in either case of the barrel waveguide such as the first embodiment or the straight waveguide (a region in which the inclination angle is greater than 0.6 degrees as shown in FIG. 12 is abnormal). In FIGS. 14 to 16, 18 and 19, the horizontal axis is shown as the width Wn2 of the second narrow portion 103e, which is for the case of the barrel waveguide according to the first embodiment and shows the width of the waveguide at the portion in contact with the output facet. Accordingly, the horizontal axis shows the width WS of the waveguide in the case of the straight waveguide, and the width WTb of the waveguide of the wide portion in the case of the tapered waveguide.

FIG. 14 is a graph showing a relationship between the width Wn2 of the second narrow portion 103e and the FFPh. FIG. 15 is a graph showing a relationship between the width Wn2 of the second narrow portion 103e and an angle of the far field pattern (FFPv) in the vertical direction. FIG. 16 is a graph showing a relationship between the width Wn2 of the second narrow portion 103e and a ratio of the FFPv to the FFPh (FFPv/FFPh).

As shown in FIGS. 14 to 16, the FFPh changes to have a local maximum value along with the change of the width Wn2. On the other hand, the FFPv increases monotonically along with the increase of the width Wn2. Consequently, the FFPv/FFPh changes to have a local minimum value along with the change of the width Wn2.

Figure 17:
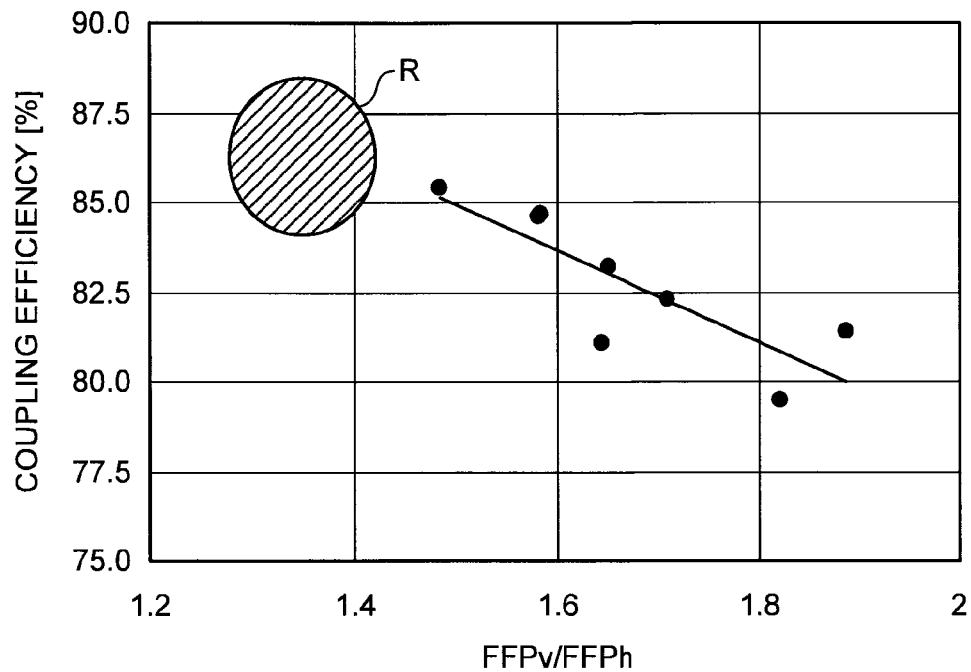
FIG. 17 is a graph showing a relationship between the FFPv/FFPh and a coupling efficiency.

FIG. 17 is a graph showing a relationship between the FFPv/FFPh and the coupling efficiency with respect to the optical fiber. Each data point in FIG. 17 is data obtained by experiment, and a solid line is an approximate straight line calculated by a least square method with respect to the data points. As is obvious from FIG. 17, as the FFPv/FFPh approaches one, the coupling efficiency becomes greater. The FFPv/FFPh being one means that a beam shape of the emitted light is a circle.

A region R shown by hatched lines shows a region where experimental data of the semiconductor laser having the waveguide S (width WS is 2 µm to 3.5 µm) of the straight waveguide according to the first comparative example is distributed. As shown in FIG. 17, because the region R contains a lot of data, the region R includes influences of variations of the lens and the semiconductor laser. However, if the coupling efficiency is around 85% or greater, the coupling efficiency can be deemed as being similar to the waveguide S of the straight waveguide according to the first comparative example having a conventional structure.

Figure 18:
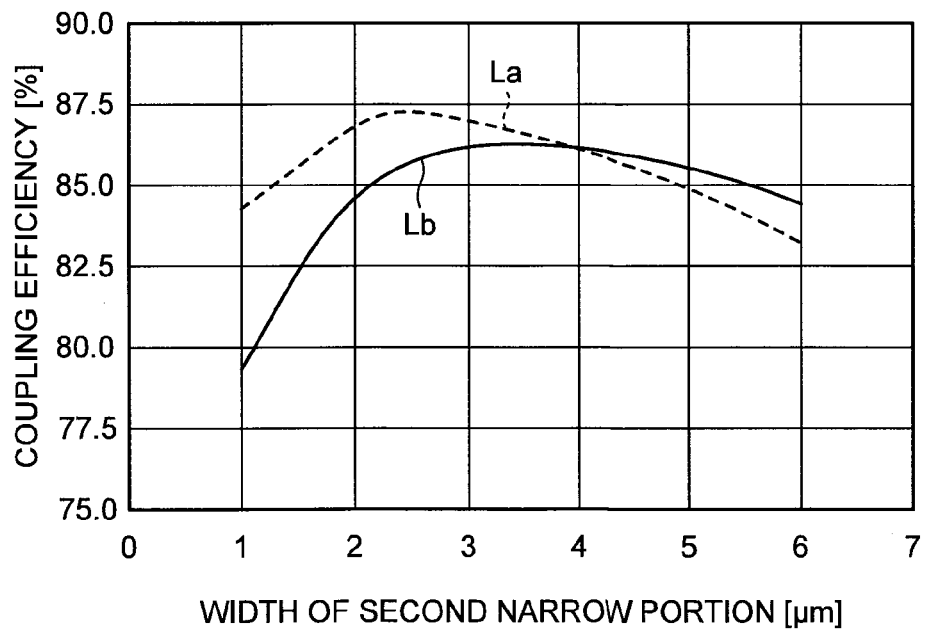
FIG. 18 is a graph showing a relationship between the width of the second narrow portion and the coupling efficiency.

FIG. 18 is a graph showing a relationship between the width Wn2 of the second narrow portion 103e and the coupling efficiency calculated from a combination of the data shown in FIG. 16 and the data of the approximate straight line shown in FIG. 17. As shown in FIG. 18, the width Wn2 is preferably in a range of 2.0 µm to 5.0 µm because the coupling efficiency becomes 85% or greater in the case of either the laser structure X or Y.

In a case of applying the laser structure Y, a case where the width WTb of the wide portion Tb of the tapered waveguide according to the second comparative example is 0.6 µm (i.e., a case where a value of the horizontal axis in FIG. 18 is 6.0 µm) and a case where the width Wn2 of the narrow second portion 103e in the first embodiment is 2.5 µm are compared based on FIG. 18, for instance. In such cases, the coupling efficiency in the second comparative example is 83.5%, and the coupling efficiency in the first embodiment is 87.5%.

Therefore, it is possible to confirm that the first embodiment can improve the coupling efficiency by 4%.

The above-mentioned coupling efficiency is a coupling efficiency in the case where the lens system 7 is a double-lens system with spherical lenses. However, in other cases where a different lens system is used, the relationship between the width Wn2 of the second narrow portion 103e and the coupling efficiency exhibits approximately the same tendency as in the case of using the double-lens system. Therefore, the Wn2 is preferably within the range of 2.0 µm to 5.0 µm.

In FIG. 14, for instance, the value of the width Wn2 of the second narrow portion 103e at a time when the FFPh becomes a maximum value is approximately the upper limit of a width for cutting off the higher-order waveguide mode. If the width Wn2 becomes wider than this value by about 1 µm, the higher-order waveguide mode is considered to become more evident. As shown in FIG. 14, a border value above which the higher-order waveguide mode starts becoming evident is 4.5 (=3.5+1) µm in the case of the laser structure X, and 3.5 (=2.5+1) µm in the case of the laser structure Y.

Therefore, when the straight waveguide is used for the semiconductor laser, the width Wn2 is designed to be smaller than the above-described width. However, as is obvious from the descriptions of FIGS. 10 and 13, it is found that a semiconductor laser having the width Wb in a range of 5.0 µm to 6.0 µm can be realized with the barrel waveguide or the tapered waveguide, which cannot be realized with the normal straight waveguide. Such tendency is due to the filtering effect of the first narrow portion 103a.

As shown in FIG. 18, between the laser structures X and Y, the coupling efficiency is greater in the case of the laser structure Y. However, the upper limit of the width of the waveguide for cutting off the higher-order waveguide mode is wider in the case of the laser structure X. Accordingly, as for the widths Wn1 and Wb having large influence over the resistance, the laser structure X allows wider widths Wn1 and Wb than the laser structure Y. Therefore, in order to improve the optical power of the semiconductor laser without considering the coupling efficiency, the laser structure X is more effective than the laser structure Y.

In FIG. 18, when the width Wn2 with which the coupling efficiency is maximized is selected in each of the laser structures X and Y, a difference between the coupling efficiencies in the two laser structures becomes about 1%. Accordingly, if it is possible to increase the optical power of the semiconductor laser high enough to resolve such difference between the coupling efficiencies, the laser structure X is more effective than the laser structure Y even if the difference between the coupling efficiencies is considered. Moreover, when the width Wb of the wide portion 103c and the width Wn1 of the first narrow portion 103a are set to be the same in both the laser structure X and the laser structure Y, the laser structure X is more preferable than the laser structure Y because the laser structure X can further suppress occurrence of the kink.

The number of layers in the quantum well layer of the active layer in the SCH-MQW structure is not particularly limited. However, it is preferable that the number of layers be equal to or less than three.

In the BH structure, the difference $\Delta n$ is generally large and is about $0.002 < \Delta n < 0.02$.

Some semiconductor lasers have a larger difference $\Delta n$ in a range of about 0.10 to 0.20. Such value of $\Delta n$ is different from the value of $\Delta n$ assumed in the present invention by a factor of about 10 or more. Therefore, there may be cases in which the behavior of the optical waveguide becomes different from the tendency having been described in this explanation. The semiconductor laser adopting a larger difference $\Delta n$ enhances the effect of optical confinement by such large difference Δn and thus aims at achieving a low threshold current. For example, in the semiconductor laser aiming at high power equal to or greater than 300 mW from the optical fiber as in the first embodiment, the difference Δn such as in a range of 0.10 to 0.20 is not preferable. This is because the influence of optical absorption due to the optical confinement becomes more evident. Here, aiming to the achievement of high power and a low threshold current as mentioned above indicates that one of them is valued more than the other, and it is needless to say that even in a high-power semiconductor laser, having a low threshold current is more preferable.

When the semiconductor laser has a BH structure while the difference Δn is approximately in a range of 0.002 to 0.02 and the waveguide is the straight waveguide, the value of FFPv/FFPh is approximately in a range of 1.1 to 1.6. In this case, a beam shape emitted from the semiconductor laser is relatively close to a circle. Therefore, a spherical lens is often used for a lens system. The first embodiment provides a semiconductor laser specifically preferable for the use of a lens system designed to execute lens coupling using a spherical lens with respect to the semiconductor laser having a straight waveguide from which the beam emitted is originally relatively close to a circle. By adopting the tapered waveguide for high power, the value of FFPv/FFPh increases, and as a result, the coupling efficiency decreases. However, by applying the second tapered portion 103d and the second narrow portion 103e, it is possible to obtain effects that the value of FFPv/FFPh and the coupling efficiency come closer to those of the straight waveguide. Therefore, it is preferable because high power and an excellent coupling efficiency can be obtained at once.

Moreover, even if the semiconductor laser does not have the BH structure, it is preferable for coupling the laser light to the optical fiber using a spherical lens system as long as the difference Δn and the value of FFPv/FFPh are within the above-described ranges.

In the first embodiment, the lens system is a double-lens system. However, the lens system is not limited to the double-lens system, while a single-lens system or an optical fiber with its end being formed into a lens to serve as a lens system can also be applied. In the case of using the lens system obtained by processing the end of the optical fiber into a lens, it is preferable to use a so called hemispherically-ended fiber obtained by processing the end of the optical fiber into a shape close to a spherical lens.

In the first embodiment, although the waveguide structure of the semiconductor laser is the BH structure, the waveguide structure is not limited to such BH structure, and other waveguide structures such as a ridge waveguide can also be applied. When the semiconductor laser has the ridge waveguide, the width of the waveguide is defined as a width of the ridge.

When the semiconductor laser is a ridge waveguide type, or an SAS (self-aligned structure) type, the difference Δn in a width direction becomes approximately equal to or less than 0.002, whereby an optical confinement in the width direction becomes weak. In this case, the value of FFPv/FFPh often becomes approximately two to four. Therefore, an asymmetric lens or a CLF (cylindrical lensed fiber) with its end being processed into a cylindrical lens is often used as the lens system.

However, even if the semiconductor laser has such structure of which value of FFPv/FFPh is large, in a case where a tapered waveguide such as the one in the second comparative example is applied to the active layer, if the lens system designed for the semiconductor laser of which active layer has a straight waveguide such as the one in the conventional comparative example is applied without any change, the coupling efficiency decreases. On the other hand, by adopting the barrel waveguide structure to the active layer as in the first embodiment, it is possible to fabricate the product with high coupling efficiency even by using the lens system designed for the conventional straight waveguide.

Figure 19:
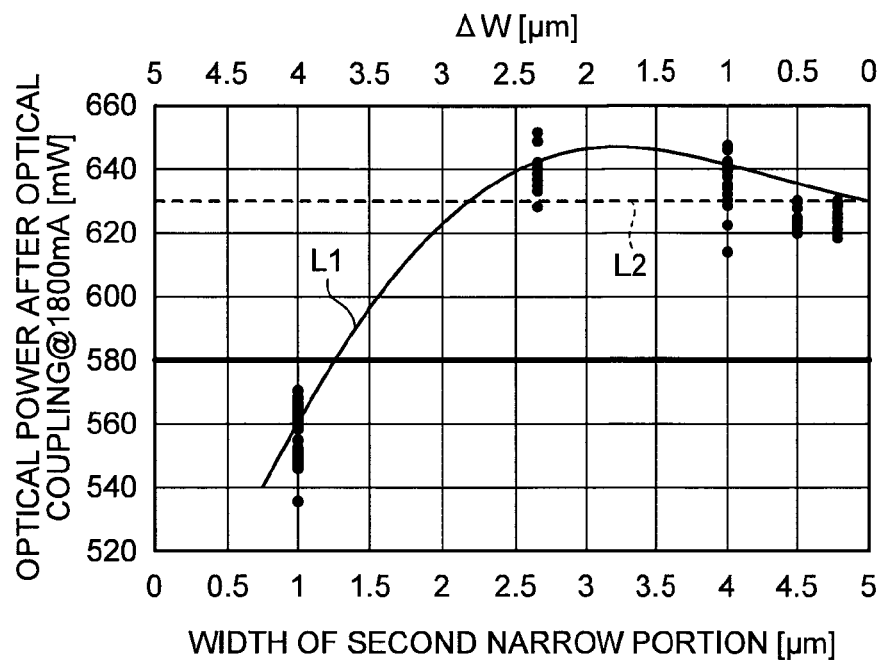
FIG. 19 is a graph showing a relationship between the width of the second narrow portion and an optical power after a coupling to an optical fiber in a case where a driving current is 1800 mA in the first embodiment and the first and second comparative examples.

FIG. 19 is a graph showing a relationship between the width of the second narrow portion and the optical power (i.e., optical power from the optical fiber) after being coupled to the optical fiber when the driving current is 1800 mA in the cases of the first embodiment and the first and second comparative examples. The relationship is calculated by applying the calculation results shown in FIG. 18 to the experimental data shown in FIG. 13. In FIG. 19, a value of the difference ΔW in the case of the first embodiment is also shown. A thin solid line in FIG. 19 is a guiding line of data points in the first embodiment.

As for the optical power shown in FIG. 13, when the width Wn2 is equal to or wider than 2.7 μm in the first embodiment, the optical power similar to the second comparative example is obtained. On the other hand, as for the optical power after the optical coupling shown in FIG. 19, in the case of the first embodiment, it is found that an optical power greater than that of the second comparative example can be obtained due to improvement of the coupling efficiency. When focusing on the horizontal axis in the upper side of the drawing, the difference ΔW is preferably within the range of 1.0 μm to 2.5 μm because the increased amount of the optical power in the first embodiment with respect to the second comparative example averagely becomes equal to or greater than 10 mW.

Next, in order to find out the influence of the second tapered portion 103d and the second narrow portion 103e on the waveguide mode, a waveguide state of the light is calculated by a BPM (beam propagation method) under the conditions that the width Wn2 is 2.7 μm, the width Wb is 6.0 μm, and the length Ln2 is 400 μm. The length Lt2 is changed from 30 μm to 450 μm. The purpose of this calculation is to find out the influence of the second tapered portion 103d and the second narrow portion 103e on the waveguide mode, so that the structure on the rear facet side ranging from a part of the wide portion 103c to the first narrow portion 103a will be omitted in the calculation. In order to find out the state, the length Ln2 is set to be large such as 400 μm.

As a result of the calculation, an interference phenomenon in which parts with weak light intensities appear at approximately equal intervals in the cavity length direction inside the second narrow portion 103e is detected. The calculation result exhibits that the parts in which distribution of optical intensity is deformed by weakening of the optical intensity appeared at intervals of about 30 μm, and the deformation converges gradually as coming closer to the output facet. Such phenomenon is considered to occur as a result of interference between a radiation mode and a waveguide mode having occurred in the second tapered portion 103d. It can be predicted that the deformation of the FFPh shown in FIG. 11 has occurred due to such interference.

It is found for the first time by the inventor's detailed study that because the interference phenomenon gradually becomes weak as reaching closer to the output facet as described above, the second narrow portion 103e needs to be long to the degree that the interference phenomenon converges to obtain an emission light unaffected by the interference phenomenon.

Accordingly, by designing the waveguide while considering such interference phenomenon to form a waveguide with which the interference phenomenon is prevented, it is possible to obtain excellent optical coupling without deformation in the FFPh of the emission light as shown in FIG. 11. The deformation in the distribution of the optical intensity occurs periodically only at a part inside the second narrow portion 103e, so that it is also considered to obtain an excellent FFP by arranging the second narrow portion 103e so that an undeformed part in the FFP corresponds to the output facet thereof without making the second narrow portion 103e long enough for the interference phenomenon to converge. However, such waveguide design is not preferable because an excellent FFP cannot be obtained in some cases when the length of the second narrow portion 103e is changed due to variations in positional accuracy of the facet cleavage that are about 10 μm at the maximum.

Figure 20:
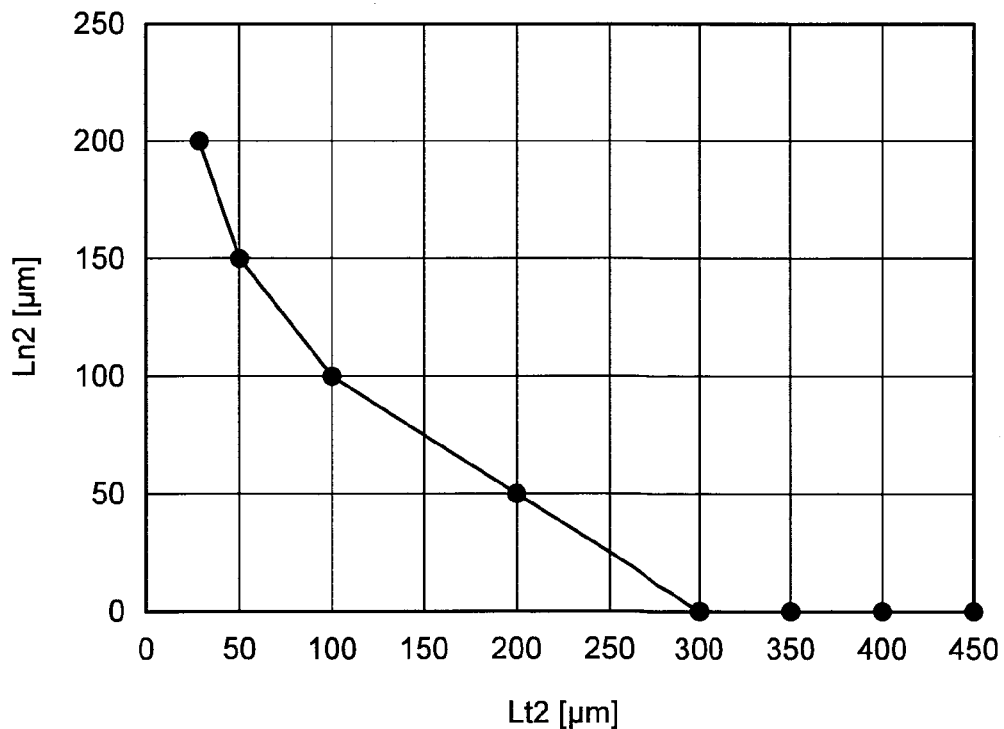
FIG. 20 is a graph showing a length Ln2 necessary for reducing an interference phenomenon in a case where a length Lt2 is changed.

FIG. 20 is a graph showing the length Ln2 necessary for reducing the interference phenomenon in a case where the length Lt2 is changed in the above calculation. As is obvious from FIG. 20, when the influence of the radiation mode is greater, the length Ln2 necessary for removing the interference phenomenon becomes larger. On the other hand, when the length Lt2 is relatively as large as 300 μm or more, the length Ln2 can be 0 μm, and the second narrow portion 103e can be omitted. However, even in such a case, it is more preferable that the second narrow portion 103e of the length of the accuracy of the cleavage, e.g. approximately 10 μm, is arranged for suppressing the variation of the width of the output facet.

Because the interference phenomenon can be considered as a phenomenon between the radiation mode and the waveguide mode, more physically, the necessary length Ln2 is determined based on the inclination angle θ instead of the length Lt2 of the second tapered portion 103d.

Figure 21:
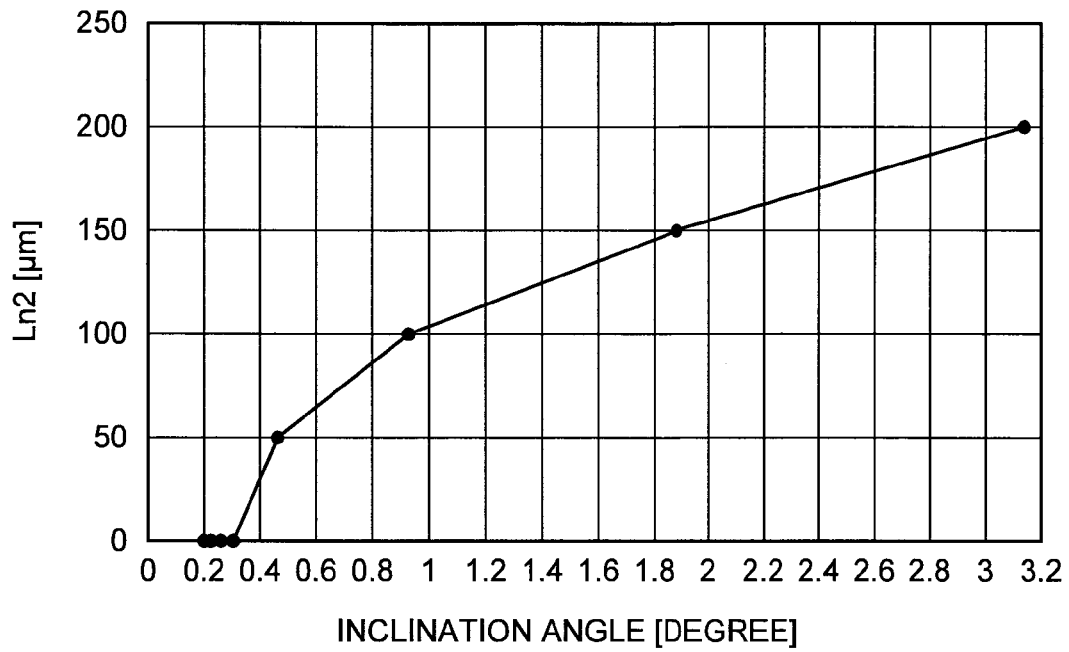
FIG. 21 is a graph showing a case where a horizontal axis in FIG. 20 represents an inclination angle θ.

FIG. 21 is a graph showing a case where a horizontal axis in FIG. 20 represents the inclination angle θ.

As is obvious from FIG. 21, a preferred range of the length Ln2 becomes a range shown in the following formulas (1) to (3).

$$Ln2 \geq 106\theta - 0.00681 \text{ (provided that } 0.47 < \theta \leq 0.60) \quad (1)$$

$$Ln2 \geq 317\theta - 100 \text{ (provided that } 0.32 < \theta \leq 0.47) \quad (2)$$

$$Ln2 \geq 0 \text{ (provided that } \theta \leq 0.32) \quad (3)$$

Here, θ≤0.60 is determined based on FIG. 11.

FIGS. 20 and 21 are graphs in which the following data is plotted.

(Lt2, Ln2, θ)=(30, 200, 3.15)
(50, 150, 1.89)
(100, 100, 0.95)
(200, 50, 0.47)
(300, 0, 0.32)
(350, 0, 0.27)
(400, 0, 0.24)
(450, 0, 0.21)

The formula (1) shows a straight line connecting the points of (Lt2, Ln2)=(100, 100) and (Lt2, Ln2)=(200, 50) in the range of 0.47<θ≤0.60. The formula (2) shows a straight line connecting the points of (Lt2, Ln2)=(200, 50) and (Lt2, Ln2)=(300, 0) in the range of 0.32<θ≤0.47.

Figure 22:
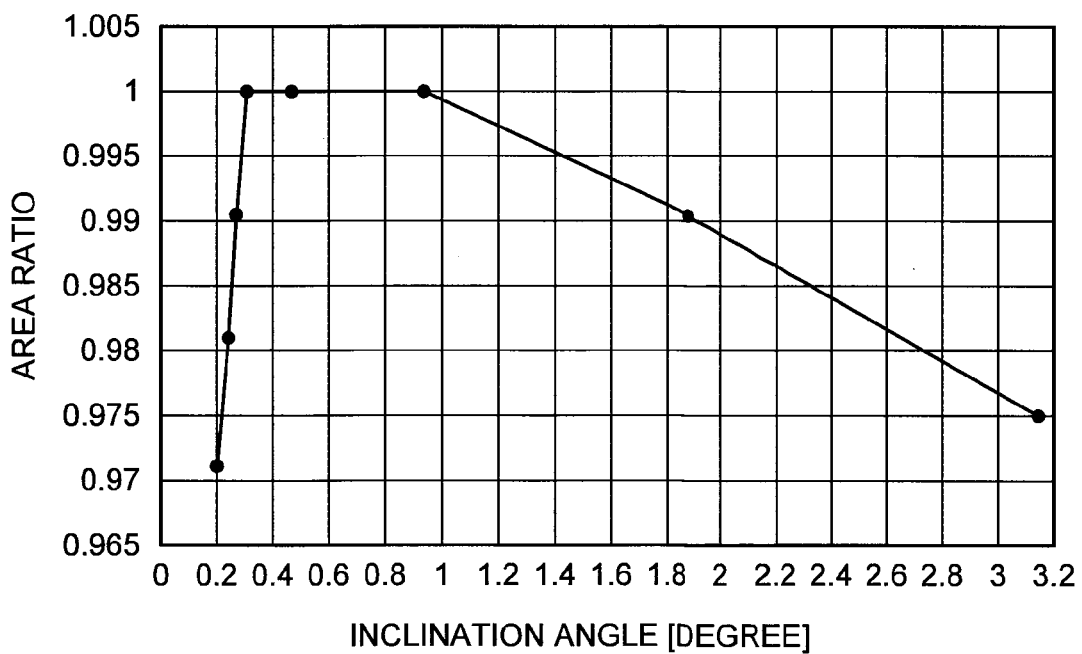
FIG. 22 is a graph showing a relationship between the inclination angle and an area of the waveguide.
Figure 23:
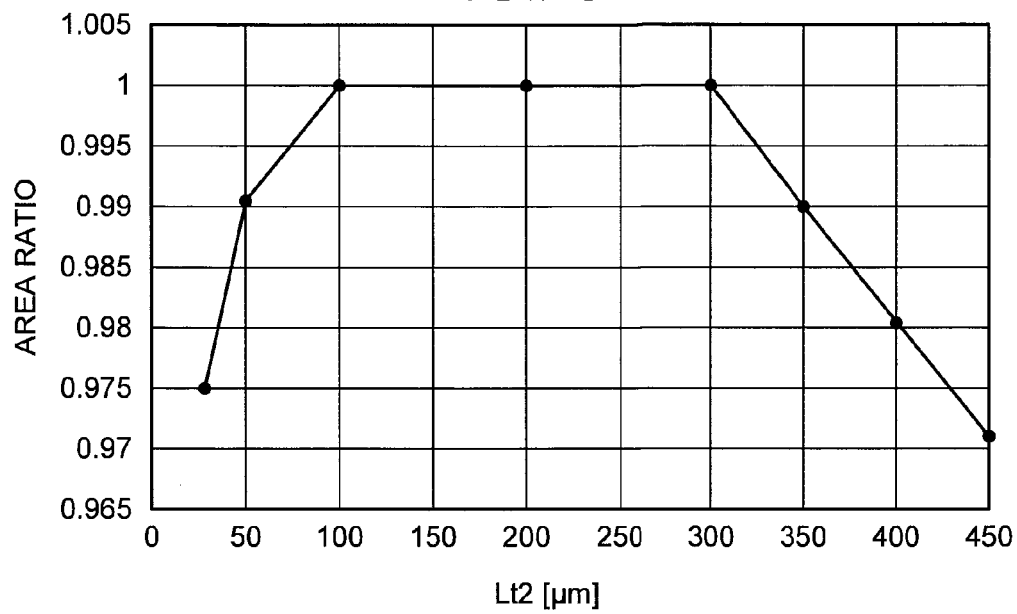
FIG. 23 is a graph showing a relationship between the Lt2 and the area of the waveguide.

FIG. 22 is a graph showing a relationship between the inclination angle and an area of the waveguide. FIG. 23 is a graph showing a relationship between the lengths Lt2 and the area of the waveguide. The following values are used for parameters other than the lengths Lt2 and Ln2 for calculating the areas in FIGS. 22 and 23. Specifically, the cavity length is set to 2000 μm, the width Wn1 and the width Wn2 are set to 2.7 μm, the width Wb is set to 6 μm, the length Lt1 is set to 300 μm, and the length Ln1 is set to 750 μm. Because the value of the area changes depending on a value of each of the above parameters, for further generalization, vertical axes in FIGS. 22 and 23 are represent the ratio with respect to the maximum area within the calculated conditions.

When the length Lt2 is small, the length Ln2 needs to be large. When the length Ln2 is small, the length Lt2 needs to be large. As is obvious from FIGS. 22 and 23, the area of the waveguide becomes small whether the length Lt2 is too small or too large.

As described above, the saturated optical power becomes small when the area of the waveguide is small. This is not preferable for achieving high power. As is evident in FIG. 23, the length Lt2 is preferably designed to be equal to or shorter than 400 μm as a guide so that the area of the waveguide becomes 98% or greater of the maximum area because the area does not become too small. It is further preferable that the length Lt2 be designed to be equal to or shorter than 350 μm so that the area becomes 99% or greater of the maximum area.

If the lengths Lt2 and Ln2 become too long, the unconformity between the distribution of the optical intensity and the distribution of the carriers is encouraged as described above, which is not preferable.

As having been proved by the inventors for the first time, if the inclination angle θ is not set appropriately, when the length Ln2 is set to 0 μm, it is expected that instability of the waveguide mode appears. In other words, the length Ln2 of 0 μm is allowed only in a limited state in terms of the area and the inclination angle, and thus it is necessary to design the length Ln2 appropriately within the range found by the inventors of the present invention.

Next, a semiconductor laser according to a second embodiment of the present invention will be described. The semiconductor laser according to the second embodiment has the same laminated structure as the semiconductor laser according to the first embodiment. However, a shape in the width direction along the optical waveguide direction of the active layer in the second embodiment is different from that of the first embodiment. In the following, this difference will be mainly described.

Figure 24:
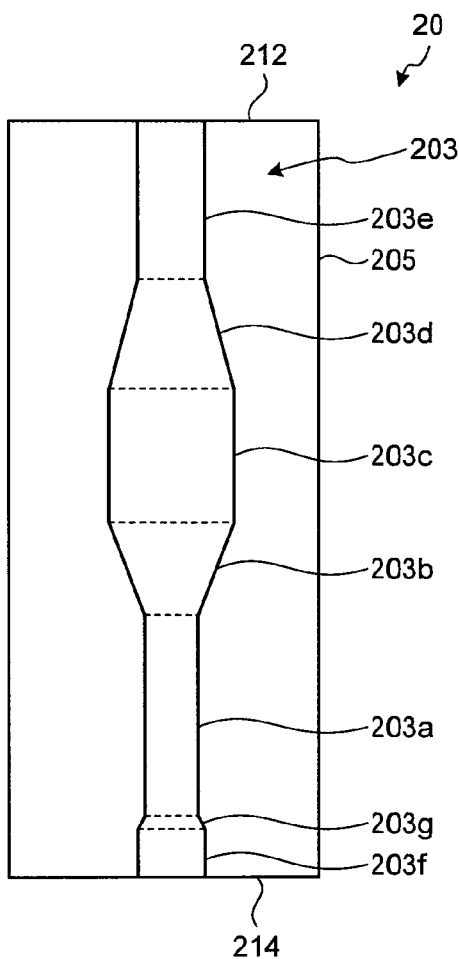
FIG. 24 is a cross-sectional view showing a waveguide structure of a semiconductor laser according to a second embodiment of the present invention.

FIG. 24 is a cross-sectional view showing a waveguide structure of the semiconductor laser according to the second embodiment, and is contrasted with FIG. 3.

As shown in FIG. 24, a semiconductor laser 20 includes an active layer 203, a lower blocking layer, and an upper blocking layer 205 similarly to the semiconductor laser 10. The lower blocking layer is made of p-InP. The upper blocking layer 205 is made of n-InP. The lower blocking layer and the upper blocking layer 205 are arranged on both sides of the active layer 203. An low reflection film (not shown) and a high reflection film (not shown) are formed on an output facet 212 and a rear facet 214 opposite to the output facet 212 in the optical waveguide direction of the semiconductor laser 20, respectively. The output facet on which the low reflection film is formed and the rear facet on which the high reflection film is formed make up a Fabry-Perot resonator.

The active layer 203 includes a first narrow portion 203a, a wide portion 203c, a second narrow portion 203e, a first tapered portion 203b, and a second tapered portion 203d. The first narrow portion 203a, the wide portion 203c, and the second narrow portion 203e are formed in this order from the rear facet 214 side so that each of them has a uniform width. The wide portion 203c has a width larger than the first narrow portion 203a. The second narrow portion 203e has a width smaller than the wide portion 203c. The first tapered portion 203b is formed between the first narrow portion 203a and the wide portion 203c, and expands toward the wide portion 203c. The second tapered portion 203d is formed between the wide portion 203c and the second narrow portion 203e, and narrows toward the second narrow portion 203e.

The active layer 203 further includes a third narrow portion 203f and a third tapered portion 203g. The third narrow portion 203f is formed on the rear facet 214 side to have a uniform width approximately the same as the second narrow portion 203e. The third tapered portion 203g is formed between the third narrow portion 203f and the first narrow portion 203a, and narrows toward the first narrow portion 203a. The third tapered portion 203g has a function to connect the third narrow portion 203f and the first narrow portion 203a under the condition of a low waveguide loss.

Figure 25:
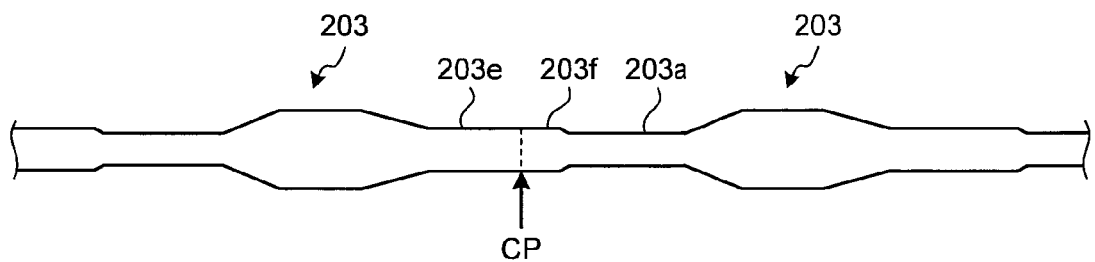
FIG. 25 is a diagram showing a state of the waveguide structure on a substrate viewed from above.

Next, a function of the third narrow portion 203f will be described. Generally, in fabricating the semiconductor laser 20, after a plurality of semiconductor lasers is formed simultaneously on a substrate, the substrate is cleaved to separate the semiconductor lasers into individual chips. Therefore, when the waveguide structure on the substrate is viewed from above, patterns of the active layer 203 are formed continuously on the substrate as shown in FIG. 25. In this case, supposing that the first narrow portion 203a and the second narrow portion 203e are directly connected between any adjacent active layers 203, when a position CP for cleaving is misaligned, a part of the second narrow portion 203e with a narrow width remains at a rear edge of the first narrow portion 203a or a part of the first narrow portion 203a with a wide width remains at a front edge of the second narrow portion 203e, which results in generating a step in the waveguide of the active layer 203, so that characteristics of the fabricated semiconductor laser 20 may deviate from the designed values.

On the contrary, in the semiconductor laser 20 in the second embodiment, because the third narrow portion 203f with approximately the same width as the second narrow portion 203e is formed on the rear facet 214 side, even if the position CP for cleaving is misaligned, a step is not generated at the front edge of the second narrow portion 203e or the rear edge of the third narrow portion 203f.

The length of the third narrow portion 203f is preferably longer than the variations in positional accuracy of the cleavage, and is, for instance, equal to or longer than 10 μm. The length of the third narrow portion 203f is preferably 50 μm. Moreover, the length of the third tapered portion 203g can also be 50 μm, for instance.

Next, a semiconductor laser according to a third embodiment of the present invention will be described. The semiconductor laser according to the third embodiment has the same laminated structure and the same shape in the width direction along the optical waveguide direction of the active layer as the semiconductor laser according to the first embodiment, however, is different in that the semiconductor laser according to the third embodiment has a current non-injection structure. Accordingly, in the following, such difference will be mainly described.

Figure 26:
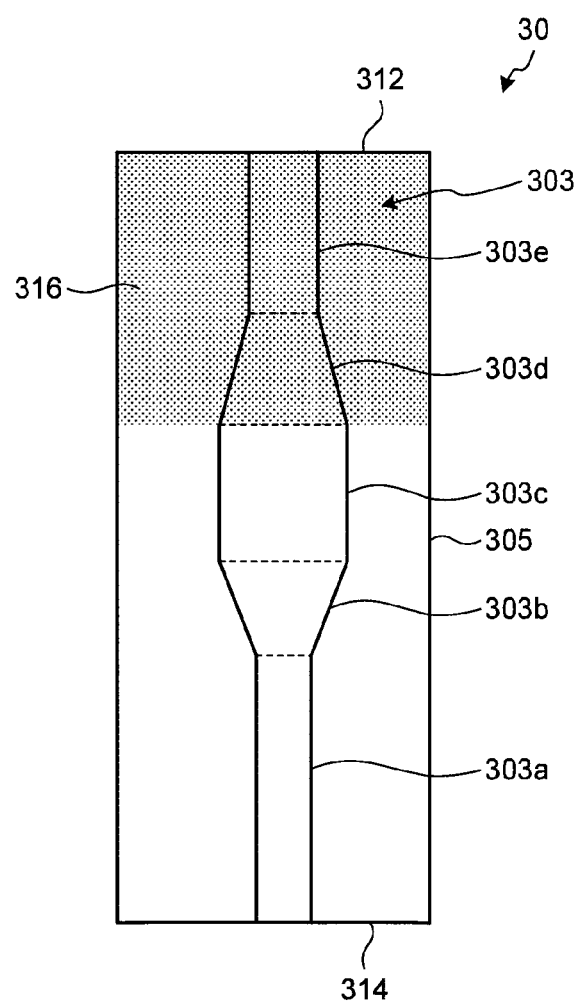
FIG. 26 is a cross-sectional view showing a waveguide structure of a semiconductor laser according to a third embodiment of the present invention.

FIG. 26 is a cross-sectional view showing a waveguide structure of the semiconductor laser according to the third embodiment, and is contrasted with FIG. 3.

As shown in FIG. 26, a semiconductor laser 30 includes an active layer 303, a lower blocking layer, and an upper blocking layer 305 similarly to the semiconductor laser 10. The lower blocking layer is made of p-InP. The upper blocking layer 305 is made of n-InP. The lower blocking layer and the upper blocking layer 305 are arranged on both sides of the active layer 303. An low reflection film (not shown) and a high reflection film (not shown) are formed on an output facet 312 and a rear facet 314 opposite to the output facet 312 in the optical waveguide direction of the semiconductor laser 30, respectively. The output facet on which the low reflection film is formed and the rear facet on which the high reflection film is formed make up a Fabry-Perot resonator.

Similarly to the active layer 103 of the semiconductor laser 10, the active layer 303 includes a first narrow portion 303a, a wide portion 303c, a second narrow portion 303e, a first tapered portion 303b, and a second tapered portion 303d. The first narrow portion 303a, the wide portion 303c and the second narrow portion 303e are formed in this order from the rear facet 314 side so that each of them has a uniform width. The wide portion 303c has a width larger than the first narrow portion 303a. The second narrow portion 303e has a width smaller than the wide portion 303c. The first tapered portion 303b is formed between the first narrow portion 303a and the wide portion 303c, and expands toward the wide portion 303c. The second tapered portion 303d is formed between the wide portion 303c and the second narrow portion 303e, and narrows toward the second narrow portion 303e.

The semiconductor laser 30 includes a current non-injection layer 316 as a current non-injection structure that is formed on the upper side of the active layer 303 to cover the second narrow portion 303e and the second tapered portion 303d. With the current non-injection layer 316, current is prevented from flowing into the second narrow portion 303e and the second tapered portion 303d, whereby unconformity that can be generated between the distribution of the optical intensity and the distribution of the carriers is resolved, and occurrence of a kink and reduction of the saturated optical power are suppressed.

The current non-injection layer 316 is realized by forming an n-type semiconductor layer made of n-InP, a dielectric layer made of SiN, or the like, for instance, between the contact layer and the p-side electrode (see FIG. 2). However, the current non-injection layer 316 is not specifically limited to such structure as long as the structure can render a non-flow state of electrical current.

In the third embodiment, the current non-injection layer 316 is formed to cover the second narrow portion 303e and the second tapered portion 303d. However, it is also acceptable that the current non-injection layer 316 is formed in a longer formation region to further cover a part of the wide portion 303c. Furthermore, it is also acceptable that the current non-injection layer 316 is formed in a shorter formation region to cover the second narrow portion 303e and a part of the second tapered portion 303d.

In the above embodiments, the coupling target of the laser light by the lens system is not limited to an optical fiber. For example, in a case where the semiconductor laser or the semiconductor laser module according to the above embodiments is used for an optical disk, the target of the laser light coupling by the lens system is a recording surface of the optical disk, or the like.

Moreover, because the semiconductor laser or the semiconductor laser module according to the above embodiments can output a high-power laser light, they are particularly suitable for use as a pumping light source (so-called a pumping laser) of which laser-oscillation wavelength is in a 1.48 μm band (in a range of about 1.38 μm to 1.52 μm). Such pumping light source can be used in an optical fiber amplifier (a Raman amplifier or an erbium-doped optical fiber amplifier), an optical fiber laser, or the like, used for optical communication or the like. Moreover, the above embodiments are preferably suitable for use as a pumping light source of which laser-oscillation wavelength is in a 0.98 μm band (in a range of about 0.92 μm to 0.99 μm). Furthermore, the above embodiments are preferably suitable in the similar manner for use as a semiconductor laser or a semiconductor laser module with a 650 μm band, in which AlGaInP-based material is used as a material of an active layer, or a semiconductor laser or a semiconductor laser module with a band from blue to ultraviolet, in which nitride semiconductor is used as a material of an active layer.

In a case of using the semiconductor laser module according to the above embodiments, it is preferable that an optical power intensity from an optical fiber for outputting laser light be equal to or greater than 300 mW.

In the semiconductor laser or the semiconductor laser module for a pumping light source, it is possible to provide a fiber bragg grating (FBG) being a wavelength selecting reflection filter in an optical fiber for outputting laser light to reduce a driving current dependency of a laser-oscillation wavelength. In the case where the FBG is provided, the FBG and an optical resonator in the semiconductor laser form a multiple resonator. It is not preferable that a structure with which a reflection point or light interference is generated be provided within the semiconductor laser because such structure makes the optical characteristic of the semiconductor laser exhibits more complex behaviors. However, the semiconductor laser according to the above embodiments does not have the structure that generats a complex reflection point or light interference inside same as the conventional straight waveguide because the wide portion and the narrow portion are connected by the tapered portion so that the width of the waveguide changes gradually. Consequently, the semiconductor laser and the semiconductor laser module according to the above embodiments can achieve high power and have characteristics comparable to the semiconductor laser with the straight waveguide structure.

Figure 27:
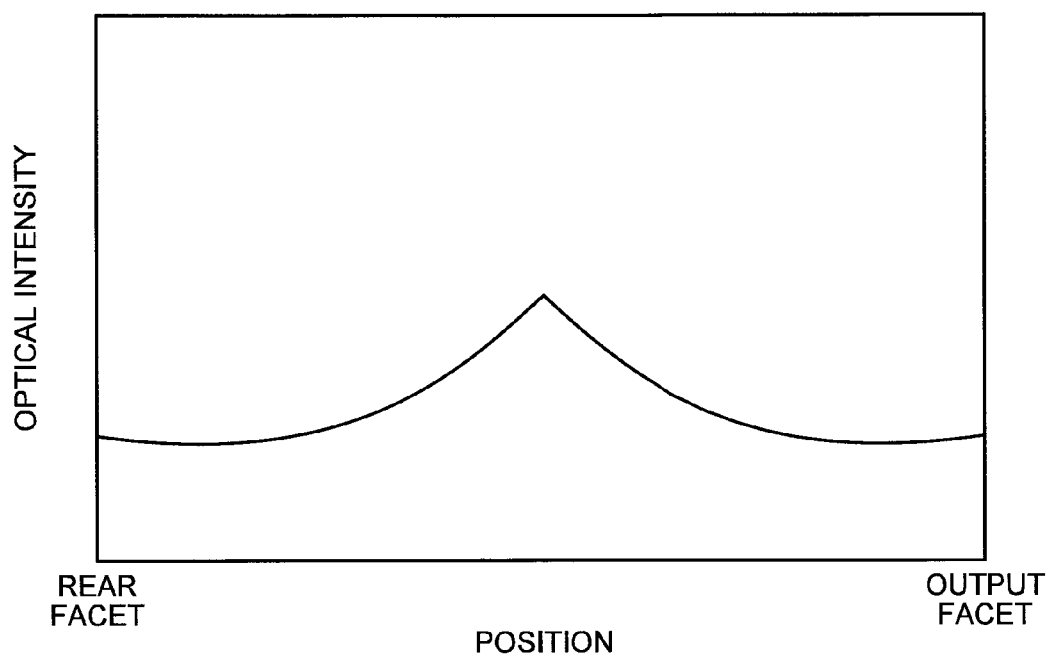
FIG. 27 is a graph showing an optical intensity distribution inside a resonator of a DFB laser by a phase shift grating.

In the above description, although the Fabry-Perot semiconductor laser has been explained as the embodiments of the present invention, the present invention can also be applied to a distributed feed back (DFB) laser with a built-in diffraction grating. Especially, a distribution of optical intensity inside a resonator of the DBF laser by a phase-shift diffraction grating will be like the one shown in FIG. 27. In FIG. 27, a horizontal axis indicates a position of the resonator, and a vertical axis indicates optical intensity. A coupling coefficient κ of the diffraction grating is 15 cm$^{-1}$, for instance. As shown in FIG. 27, in the DBF laser by a phase-shift grating, optical intensity of a central portion of the resonator tends to be high, and the optical intensity tends to decrease on the facet side. Therefore, the barrel waveguide as the above embodiments is suitable in achieving high power because distribution of optical intensity and distribution of carriers conform with each other. Because the distribution of the optical intensity and the distribution of the carriers conform with each other, a hole-burning can be suppressed, and a line width of the output laser light can be made narrower.

The present invention is not limited to the above-described embodiments. The present invention includes ones obtained by appropriately combining the structural elements of the above-described embodiments.

Japanese Patent Application Laid-Open No. 2002-280668 describes in paragraph 0065 discloses an example in which a width of a waveguide on an output facet side is narrowed by switching the output facet and a rear facet of the tapered waveguide as shown in FIG. 7. Japanese Patent Application Laid-Open No. 2002-280668 describes about a problem in that a kink occurs in such structure, however, does not provide any solution to such problem.

On the other hand, the present invention provides a new waveguide structure such as the barrel waveguide. As described above, in the barrel waveguide, each portion has a specific function. Therefore, it is not possible to achieve excellent characteristics with any one of them lacking.

Moreover, detailed examination by the inventors of the present invention has made clear the phenomenon that further excellent waveguide mode can be achieved by designing each of the structural elements of the waveguide in the barrel waveguide more properly. Japanese Patent Application Laid-Open No. 2002-280668 also refers to the kink that is a problem particularly in the field of high power laser. However, the interference phenomenon in the second narrow portion and the accompanying deformation of the FFP are problems that has been made clear for the first time by the inventors of the present invention as a result of their detail examination. Because the problems were found for the first time in the process of examining the present invention, it can be believed that one skilled in the art cannot easily come up with the structure that can be the solution to such problems.

Additional advantages and modifications will readily occur to those skilled in the art. Therefore, the disclosure in its broader aspects is not limited to the specific details, representative embodiments and alternate examples shown and described herein. Accordingly, various modifications may be made without departing from the spirit or scope of the general inventive concept as defined by the appended claims and their equivalents. Furthermore, the above-mentioned embodiments and the alternate examples can be arbitrarily combined with one another.

What is claimed is:

1. A semiconductor laser for outputting laser light from an output facet of a waveguide having an index waveguide structure, via a lens system, wherein the waveguide is formed by an active layer, the active layer of the waveguide includes, in order from a rear facet opposite to the output facet, a first narrow portion configured to filter a higher-order waveguide mode, a wide portion that is wider than the first narrow portion, a second narrow portion narrower than the wide portion, a first tapered portion formed between the first narrow portion and the wide portion, the first tapered portion expanding toward the wide portion, and a second tapered portion formed between the wide portion and the second narrow portion, the second tapered portion narrowing toward the second narrow portion, and each of the first narrow portion, the wide portion, and the second narrow potion has a uniform width, the width of the second narrow portion of the waveguide is in a range of 2.0 micrometers to 5.0 micrometers, an inclination angle θ represented by θ=arctan[(ΔW/2)/Lt2] is 0.6 degrees or less, where ΔW is a difference between the width of the wide portion and the width of the second narrow portion, and Lt2 is a length of the second tapered portion, the inclination angle θ and Ln2, which is a length of the second narrow portion in micrometers, satisfy $Ln2 \geq 106\theta - 0.00681$ when $0.47 < \theta < 0.60$, $Ln2 \geq 317\theta - 100$ when $0.32 < \theta < 0.47$, and $Ln2 \geq 0$ when $\theta \leq 0.32$, an upper limit of Ln2 is 200 micrometers in all ranges of the inclination angle θ, and a length of the first narrow portion is equal to or longer than 30% of a cavity length between the output facet and the rear facet and equal to or shorter than 65% of the cavity length.

2. The semiconductor laser according to claim 1, wherein a difference between the width of the wide portion and the width of the second narrow portion is in a range of 1.0 micrometer to 3.3 micrometers.

3. The semiconductor laser according to claim 1, wherein the length of the second tapered portion is equal to or longer than 50 micrometers and equal to or shorter than 400 micrometers.

4. The semiconductor laser according to claim 1, wherein the cavity length of a resonator that is made up with the output facet and the rear facet is equal to or longer than 1000 micrometers and equal to or shorter than 4000 micrometers.

5. The semiconductor laser according to claim 1, wherein the semiconductor laser is a distributed feedback laser.

6. The semiconductor laser according to claim 1, wherein the semiconductor laser is a distributed feedback laser employing a phase-shift diffraction grating.

7. A semiconductor laser module, comprising:
a semiconductor laser for outputting laser light from an output facet of a waveguide having an index waveguide structure;
a coupling target to which the laser light is to be coupled; and
a lens system that couples the laser light to the coupling target, wherein
the waveguide is formed by an active layer,
the active layer of the waveguide includes, in order from a rear facet opposite to the output facet,
a first narrow portion configured to filter a higher-order waveguide mode,
a wide portion that is wider than the first narrow portion,
a second narrow portion narrower than the wide portion,
a first tapered portion formed between the first narrow portion and the wide portion, the first tapered portion expanding toward the wide portion, and
a second tapered portion formed between the wide portion and the second narrow portion, the second tapered portion narrowing toward the second narrow portion, and
each of the first narrow portion, the wide portion, and the second narrow potion has a uniform width,
the width of the second narrow portion of the waveguide is in a range of 2.0 micrometers to 5.0 micrometers,
an inclination angle $\theta$ represented by $\theta=\arctan[(\Delta W/2)/Lt2]$ is 0.6 degrees or less, where $\Delta W$ is a difference between the width of the wide portion and the width of the second narrow portion, and $Lt2$ is a length of the second tapered portion,
the inclination angle $\theta$ and $Ln2$, which is a length of the second narrow portion in micrometers, satisfy $Ln2 \geq 106\theta - 0.00681$ when $0.47 < \theta < 0.60$, $Ln2 \geq 317\theta - 100$ when $0.32 < \theta < 0.47$, and $Ln2 \geq 0$ when $\theta \leq 0.32$, an upper limit of $Ln2$ is 200 micrometers in all ranges of the inclination angle $\theta$, and
a length of the first narrow portion is equal to or longer than 30% of a cavity length between the output facet and the rear facet and equal to or shorter than 65% of the cavity length.

8. The semiconductor laser module according to claim 7, wherein
the coupling target is an optical fiber, and
optical power of a laser light output from the optical fiber is equal to or greater than 300 milliwatts.

* * * * *